(12) United States Patent
Muller

(10) Patent No.: US 11,837,373 B2
(45) Date of Patent: Dec. 5, 2023

(54) HAZARDOUS MATERIAL REPOSITORY SYSTEMS AND METHODS

(71) Applicant: Deep Isolation, Inc., Berkeley, CA (US)

(72) Inventor: Richard A. Muller, Berkeley, CA (US)

(73) Assignee: Deep Isolation, Inc., Berkeley, CA (US)

( * ) Notice: Subject to any disclaimer, the term of this patent is extended or adjusted under 35 U.S.C. 154(b) by 0 days.

(21) Appl. No.: 17/750,632

(22) Filed: May 23, 2022

(65) Prior Publication Data

US 2022/0288658 A1 Sep. 15, 2022

Related U.S. Application Data

(63) Continuation of application No. 17/001,057, filed on Aug. 24, 2020, now Pat. No. 11,338,338, which is a (Continued)

(51) Int. Cl.
*G21D 7/04* (2006.01)
*G21F 9/34* (2006.01)
(Continued)

(52) U.S. Cl.
CPC .............. *G21D 7/04* (2013.01); *B09B 1/008* (2013.01); *E21B 41/005* (2013.01); *E21B 41/0085* (2013.01); *G21F 9/34* (2013.01); *G21H 1/103* (2013.01); *H10N 10/13* (2023.02); *E21B 7/04* (2013.01); *E21B 33/12* (2013.01); *E21B 33/1204* (2013.01); *E21B 33/1208* (2013.01); *G21F 1/00* (2013.01); *Y02E 30/00* (2013.01)

(58) Field of Classification Search
CPC ....... E21B 41/0085; G21F 9/34; G21H 1/103; H10N 10/13
See application file for complete search history.

(56) References Cited

U.S. PATENT DOCUMENTS 1,631,419 A 6/1927 Myron
3,379,013 A 4/1968 Slagle et al.
(Continued)

FOREIGN PATENT DOCUMENTS

GB 2151839 7/1985
WO WO 92007667 5/1992
(Continued)

OTHER PUBLICATIONS

[No Author] World Nuclear News, "Yucca Mountain cost estimate rises to $96 billion," Aug. 6, 2008, 2 pages, ISSN 2040-5766.
(Continued)

*Primary Examiner* — Janine M Kreck
(74) *Attorney, Agent, or Firm* — Fish & Richardson P.C.

(57) ABSTRACT

A power generator system includes one or more heat transfer members configured to contact: a heat source in a hazardous waste repository of a directional drillhole that stores nuclear waste in one or more nuclear waste canisters, and a heat sink in the hazardous waste repository; and one or more thermoelectric generators thermally coupled to the one or more heat transfer members and configured to generate electric power based on a temperature difference between the heat source and the heat sink.

20 Claims, 8 Drawing Sheets

Related U.S. Application Data continuation of application No. 16/796,821, filed on Feb. 20, 2020, now Pat. No. 10,751,769.

(60) Provisional application No. 62/833,106, filed on Apr. 12, 2019, provisional application No. 62/808,791, filed on Feb. 21, 2019, provisional application No. 62/808,813, filed on Feb. 21, 2019, provisional application No. 62/808,565, filed on Feb. 21, 2019, provisional application No. 62/808,623, filed on Feb. 21, 2019.

(51) Int. Cl.
| | | |
|---|---|---|
| B09B 1/00 | (2006.01) | |
| E21B 41/00 | (2006.01) | |
| G21H 1/10 | (2006.01) | |
| H10N 10/13 | (2023.01) | |
| G21F 1/00 | (2006.01) | |
| E21B 7/04 | (2006.01) | |
| E21B 33/12 | (2006.01) | |

(56) References Cited

U.S. PATENT DOCUMENTS

| | | | |
|---|---|---|---|
| 3,899,631 A | 8/1975 | Clark | |
| 4,379,493 A | 4/1983 | Thibodeaux | |
| 4,452,478 A | 6/1984 | Dulaney | |
| 4,708,522 A | 11/1987 | Bergman et al. | |
| 4,825,088 A * | 4/1989 | Nair | G21F 5/12 |
| | | | 976/DIG. 348 |
| 4,906,135 A | 3/1990 | Brassow et al. | |
| 5,165,235 A | 11/1992 | Nitschke | |
| 5,202,522 A | 4/1993 | Williams | |
| 5,265,678 A | 11/1993 | Grundmann | |
| 5,340,235 A | 8/1994 | Milliken | |
| 5,377,104 A | 12/1994 | Sorrells et al. | |
| 5,387,741 A | 2/1995 | Shuttle | |
| 5,524,709 A | 6/1996 | Withers | |
| 5,589,603 A | 12/1996 | Alexander et al. | |
| 5,785,133 A | 7/1998 | Murray et al. | |
| 5,850,614 A | 12/1998 | Crichlow | |
| 5,863,283 A | 1/1999 | Gardes | |
| 5,868,210 A | 2/1999 | Johnson et al. | |
| 6,150,601 A * | 11/2000 | Schnatzmeyer | H10N 10/00 |
| | | | 136/211 |
| 6,238,138 B1 | 5/2001 | Crichlow | |
| 6,923,263 B2 | 8/2005 | Eden | |
| 7,068,748 B2 | 6/2006 | Singh | |
| 7,287,934 B2 | 10/2007 | Okutsu et al. | |
| 8,933,289 B2 | 1/2015 | Crichlow | |
| 9,181,775 B2 | 11/2015 | Eden | |
| 9,852,822 B2 | 12/2017 | Singh | |
| 10,002,683 B2 | 6/2018 | Muller et al. | |
| 10,265,743 B1 | 4/2019 | Muller et al. | |
| 10,300,512 B2 | 5/2019 | Muller et al. | |
| 10,315,238 B1 | 6/2019 | Muller et al. | |
| 10,446,287 B2 | 10/2019 | Singh | |
| 10,614,927 B2 | 4/2020 | Muller et al. | |
| 10,751,769 B1 | 8/2020 | Muller et al. | |
| 11,338,338 B2 | 5/2022 | Muller | |
| 2002/0020528 A1 | 2/2002 | McCabe et al. | |
| 2005/0207525 A1 | 9/2005 | Singh | |
| 2008/0308271 A1 | 12/2008 | Chouzenoux et al. | |
| 2010/0105975 A1 | 4/2010 | Baird | |
| 2010/0307756 A1 | 12/2010 | Jung et al. | |
| 2011/0005762 A1 | 1/2011 | Poole | |
| 2012/0298359 A1 | 11/2012 | Eden | |
| 2018/0144841 A1 | 5/2018 | Singh | |
| 2018/0290188 A1 * | 10/2018 | Crichlow | B09B 1/008 |
| 2018/0345336 A1 | 12/2018 | Muller et al. | |
| 2019/0099790 A1 | 4/2019 | Muller et al. | |
| 2019/0318838 A1 | 10/2019 | Muller et al. | |
| 2019/0323342 A1 | 10/2019 | Pedersen | |
| 2020/0023416 A1 | 1/2020 | Muller et al. | |
| 2020/0273593 A1 | 8/2020 | Muller et al. | |
| 2020/0391260 A1 | 12/2020 | Muller | |
| 2022/0010656 A1 * | 1/2022 | Utter | E21B 23/14 |

FOREIGN PATENT DOCUMENTS

| | | | |
|---|---|---|---|
| WO | WO 2005012688 | | 2/2005 |
| WO | WO 2015069300 | | 5/2015 |
| WO | WO-2016138389 A1 * | | 9/2016 |
| WO | WO 2016177876 | | 11/2016 |

OTHER PUBLICATIONS

Arnold, et al., "Reference Design and Operations of Deep Borehole Disposal of High-Level Radioactive Waste," Sandia National Laboratories, 2011 ("Sandia Report"), available at: http://prod.sandia.gov/techlib/access-control.cgi/2011/116749.pdf.

Cornwall, "Deep Sleep. Boreholes drilled into Earth's crust get a fresh look for nuclear waste disposal," Science, Jul. 10, 2015, 349(6244):132-35.

Dozier, "Feasibility of Very Deep Borehole Disposal of US Nuclear Defense Wastes," Massachusetts Institute of Technology, Sep. 2011, pp. 1-12.

Faybishenko et al., Editors, Lawrence Berkeley National Laboratory and Sandia National Laboratories: "International Approaches for Deep Geological Disposal of Nuclear Waste: Geological Challenges in Radioactive Waste Isolation", prepared for the US Department of Energy, Fifth Worldwide Review—2016, 474 pages.

Gibb et al., "A Model for Heat Flow in Deep Borehole Disposals of High-Level Nuclear Waste," Journal of Geophysical Research, vol. 113, dated May 6, 2008, 18 pages.

Gibbs, "Feasibility of Lateral Emplacement in Very Deep Borehole Disposal of High Level Nuclear Waste," Master's thesis, Massachusetts Institute of Technology, 2010, available at: https://dspace.mit.edu/handle/1721.1/63242, 2 pages.

Hoag, "Canister Design for Deep Borehole Disposal of Nuclear Waste," Massachusetts Institute of Technology, May 2006, pp. 1-6.

Neuzil et al., "Shale: An overlooked option for US nuclear waste disposal," Bulletin of the Atomic Scientists Nov. 2014, Retrieved from the Internet: http://thebulletin.org/shale-overlooked-option-US-nuclear-waste-disposal7831 printed Sep. 26, 2016, 5 pages.

Neuzil, "Can Shale Safely Host U.S. Nuclear Waste?" EOS, vol. 94, No. 30, Dated Jul. 23, 2013, 3 pages.

PCT International Preliminary Report on Patentability in International Appln. No. PCT/US2020/019225, dated Sep. 2, 2021, 8 pages.

PCT International Search Report and Written Opinion in International Appln. No. PCT/US2020/019225, dated Oct. 27, 2020,.

Performance Confirmation Concepts Study Report Civilian Radioactive Waste Management System Management & Operating Contractor TRW 1996.

Sone et al., "Mechanical properties of shale-gas reservoir rocks—Part 1:Static and dynamic elastic properties and anisotropy," Geophysics, Sep./Oct. 2013, 78(5):D381-92.

U.S. Nuclear Waste Technical Review Board, "A Report To the U.S. Congress and the Secretary of Energy, Evaluation of Technical Issues Associated With the Development of a Separate Repository for U.S. Department of Energy—Managed High-Level Radioactive Waste and Spent Nuclear Fuel," 2015, ("NWTRB"), available at: http://www.nwtrb.gov/reports/disposal_options.pdf.

Vartabedian, "Decades-old war over Yucca Mountain nuclear dump resumes under Trump budget plan," Mar. 29, 2017, ralph.vartabdian@latimes.com, twitter @rvartabedian; 4 pages.

Winterle et al., "Regulatory Perspectives on Deep Borehole Disposal Concepts," prepared for the U.S. Nuclear Regulatory Commission, Contract NRC-02-07006, Center for Nuclear Waste Regulatory Analyses, San Antonio, TX, May 2011, 24 pages.

YuccaMountain.org; Eureka County, Nevada—Nuclear Waste Office, FAQ, Eureka County Home, last updated Mar. 17, 2017; 12 pages.

* cited by examiner

HAZARDOUS MATERIAL REPOSITORY SYSTEMS AND METHODS

CROSS-REFERENCE TO RELATED APPLICATION

This application is a continuation of, and claims priority under 35 U.S.C. § 120 to, U.S. patent application Ser. No. 17/001,057, filed on Aug. 24, 2020, which claims priority under 35 U.S.C. § 120 to, U.S. patent application Ser. No. 16/796,821, filed on Feb. 20, 2020, now U.S. Pat. No. 10,751,769, which in turn claims priority under 35 U.S.C. § 119 to: U.S. Provisional Patent Application Ser. No. 62/808,565, filed on Feb. 21, 2019; U.S. Provisional Patent Application Ser. No. 62/808,623, filed on Feb. 21, 2019; U.S. Provisional Patent Application Ser. No. 62/808,791, filed on Feb. 21, 2019; U.S. Provisional Patent Application Ser. No. 62/808,813, filed on Feb. 21, 2019; and U.S. Provisional Patent Application Ser. No. 62/833,106, filed on Apr. 12, 2019. The entire contents of each of the previous applications are incorporated by reference herein.

TECHNICAL FIELD

This disclosure relates to hazardous material repository systems and methods.

BACKGROUND

Hazardous material, such as radioactive waste, is often placed in long-term, permanent, or semi-permanent storage so as to prevent health issues among a population living near the stored waste. Such hazardous waste storage is often challenging, for example, in terms of storage location identification and surety of containment. For instance, the safe storage of nuclear waste (e.g., spent nuclear fuel, whether from commercial power reactors, test reactors, or even high-grade military waste) is considered to be one of the outstanding challenges of energy technology. Safe storage of the long-lived radioactive waste is a major impediment to the adoption of nuclear power in the United States and around the world. Conventional waste storage methods have emphasized the use of tunnels, and is exemplified by the design of the Yucca Mountain storage facility. Other techniques include boreholes, including vertical boreholes, drilled into crystalline basement rock. Other conventional techniques include forming a tunnel with boreholes emanating from the walls of the tunnel in shallow formations to allow human access.

SUMMARY

In an example implementation, a power generator system includes one or more heat transfer members configured to contact: a heat source in a hazardous waste repository of a directional drillhole that stores nuclear waste in one or more nuclear waste canisters, and a heat sink in the hazardous waste repository; and one or more thermoelectric generators thermally coupled to the one or more heat transfer members and configured to generate electric power based on a temperature difference between the heat source and the heat sink.

In an aspect combinable with the example implementation, the nuclear waste comprises spent nuclear fuel.

In another aspect combinable with any of the previous aspects, the heat source comprises at least one of the nuclear waste canisters or a casing disposed in the drillhole.

In another aspect combinable with any of the previous aspects, the heat sink comprises at least one of the casing disposed in the drillhole or a material that at least partially fills the drillhole.

In another aspect combinable with any of the previous aspects, the material comprises a liquid.

Another aspect combinable with any of the previous aspects further includes one or more biasing members configured to urge the one or more heat transfer members into thermal contact with the heat source and the heat sink.

Another aspect combinable with any of the previous aspects further includes at least one radiation shield.

In another aspect combinable with any of the previous aspects, the radiation shield comprises tungsten.

In another aspect combinable with any of the previous aspects, the one or more heat transfer members comprise a radiation resistant material.

In another aspect combinable with any of the previous aspects, the one or more thermoelectric generators comprise a radiation resistant material.

Another example implementation includes a method for generating power in a hazardous waste repository of a directional drillhole that stores nuclear waste that includes contacting, with one or more heat transfer members of a power generator system, a heat source in the hazardous waste repository of the directional drillhole that stores nuclear waste in one or more nuclear waste canisters; contacting, with the one or more heat transfer members of the power generator system, a heat sink in the hazardous waste repository; and generating electric power with one or more thermoelectric generators thermally coupled to the one or more heat transfer members based on a temperature difference between the heat source and the heat sink.

In an aspect combinable with the example implementation, the nuclear waste comprises spent nuclear fuel.

In another aspect combinable with any of the previous aspects, the heat source comprises at least one of the nuclear waste canisters or a casing disposed in the drillhole.

In another aspect combinable with any of the previous aspects, the heat sink comprises at least one of the casing disposed in the drillhole or a material that at least partially fills the drillhole.

In another aspect combinable with any of the previous aspects, the material comprises a liquid.

Another aspect combinable with any of the previous aspects further includes urging, with one or more biasing members of the power generator system, the one or more heat transfer members into thermal contact with the heat source and the heat sink.

Another aspect combinable with any of the previous aspects further includes shielding gamma rays generated by the nuclear waste from the power generator system with at least one radiation shield.

In another aspect combinable with any of the previous aspects, the radiation shield comprises tungsten.

In another aspect combinable with any of the previous aspects, the one or more heat transfer members comprise a radiation resistant material.

In another aspect combinable with any of the previous aspects, the one or more thermoelectric generators comprise a radiation resistant material.

Implementations of hazardous waste repository systems and methods according to the present disclosure may also include one or more of the following features. For example, a hazardous waste repository may be used to store hazardous waste material, such as spent nuclear fuel, isolated from human-consumable water sources. The hazardous waste repository may be suitable for storing the hazardous waste, such as radioactive or nuclear waste, for durations of time up to, for example, 1,000,000 years. Other features are described herein.

The details of one or more implementations of the subject matter described in this disclosure are set forth in the accompanying drawings and the description below. Other features, aspects, and advantages of the subject matter will become apparent from the description, the drawings, and the claims.

DETAILED DESCRIPTION

Figure 1:
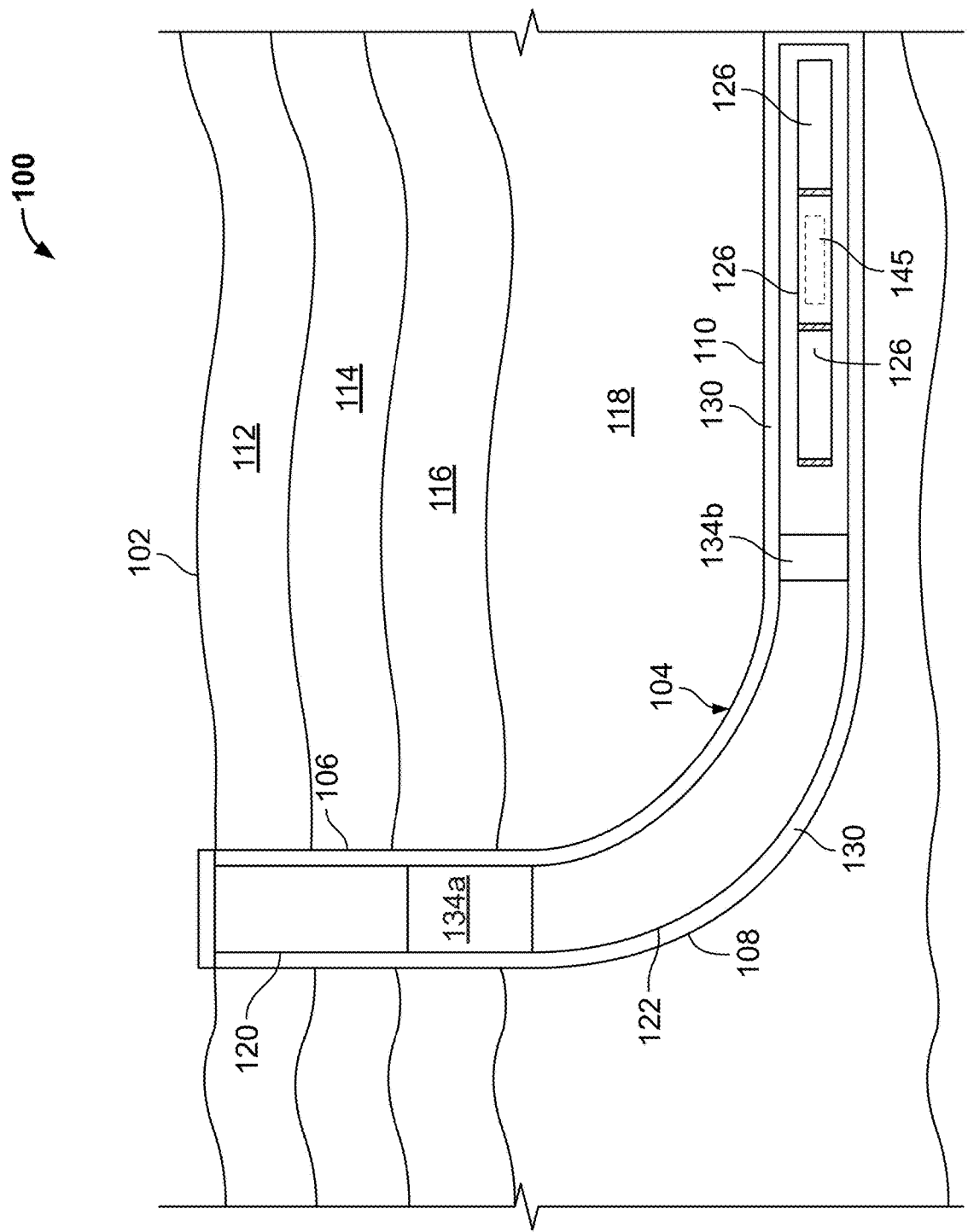
FIG. 1 is a schematic illustration of an example implementation of a hazardous waste repository that includes one or more hazardous material canisters according to the present disclosure.

FIG. 1 is a schematic illustration of an example implementation of a hazardous waste repository 100 (also referred to as a hazardous waste repository system), e.g., a subterranean location for the long-term (e.g., tens, hundreds, or thousands of years or more), but retrievable, safe and secure storage of hazardous material (e.g., radioactive material, such as nuclear waste which can be spent nuclear fuel (SNF) or high level waste, as two examples). For example, this figure illustrates the example hazardous waste repository 100 once one or more canisters 126 of hazardous material have been deployed in a subterranean formation 118. As illustrated, the hazardous waste repository 100 includes a drillhole 104 formed (e.g., drilled or otherwise) from a terranean surface 102 and through multiple subterranean layers 112, 114, 116, and 118. Although the terranean surface 102 is illustrated as a land surface, terranean surface 102 may be a sub-sea or other underwater surface, such as a lake or an ocean floor or other surface under a body of water. Thus, the present disclosure contemplates that the drillhole 104 may be formed under a body of water from a drilling location on or proximate the body of water.

The illustrated drillhole 104 is a directional drillhole in this example of hazardous waste repository 100. For instance, the drillhole 104 includes a substantially vertical portion 106 coupled to a radiussed or curved portion 108, which in turn is coupled to a substantially horizontal portion 110. As used in the present disclosure, "substantially" in the context of a drillhole orientation, refers to drillholes that may not be exactly vertical (e.g., exactly perpendicular to the terranean surface 102) or exactly horizontal (e.g., exactly parallel to the terranean surface 102), or exactly inclined at a particular incline angle relative to the terranean surface 102. In other words, vertical drillholes often undulate offset from a true vertical direction, that they might be drilled at an angle that deviates from true vertical, and inclined drillholes often undulate offset from a true incline angle. Further, in some aspects, an inclined drillhole may not have or exhibit an exactly uniform incline (e.g., in degrees) over a length of the drillhole. Instead, the incline of the drillhole may vary over its length (e.g., by 1-5 degrees). As illustrated in this example, the three portions of the drillhole 104—the vertical portion 106, the radiussed portion 108, and the horizontal portion 110—form a continuous drillhole 104 that extends into the Earth. As used in the present disclosure, the drillhole 104 (and drillhole portions described) may also be called wellbores. Thus, as used in the present disclosure, drillhole and wellbore are largely synonymous and refer to bores formed through one or more subterranean formations that are not suitable for human-occupancy (i.e., are too small in diameter for a human to fit there within).

The illustrated drillhole 104, in this example, has a surface casing 120 positioned and set around the drillhole 104 from the terranean surface 102 into a particular depth in the Earth. For example, the surface casing 120 may be a relatively large-diameter tubular member (or string of members) set (e.g., cemented) around the drillhole 104 in a shallow formation. As used herein, "tubular" may refer to a member that has a circular cross-section, elliptical cross-section, or other shaped cross-section. For example, in this implementation of the hazardous waste repository 100, the surface casing 120 extends from the terranean surface through a surface layer 112. The surface layer 112, in this example, is a geologic layer comprised of one or more layered rock formations. In some aspects, the surface layer 112 in this example may or may not include freshwater aquifers, salt water or brine sources, or other sources of mobile water (e.g., water that moves through a geologic formation). In some aspects, the surface casing 120 may isolate the drillhole 104 from such mobile water, and may also provide a hanging location for other casing strings to be installed in the drillhole 104. Further, although not shown, a conductor casing may be set above the surface casing 120 (e.g., between the surface casing 120 and the surface 102 and within the surface layer 112) to prevent drilling fluids from escaping into the surface layer 112.

As illustrated, a production casing 122 is positioned and set within the drillhole 104 downhole of the surface casing 120. Although termed a "production" casing, in this example, the casing 122 may or may not have been subject to hydrocarbon production operations. Thus, the casing 122 refers to and includes any form of tubular member that is set (e.g., cemented) in the drillhole 104 downhole of the surface casing 120. In some examples of the hazardous waste repository 100, the production casing 122 may begin at an end of the radiussed portion 108 and extend throughout the horizontal portion 110. The casing 122 could also extend into the radiussed portion 108 and into the vertical portion 106.

As shown, cement 130 is positioned (e.g., pumped) around the casings 120 and 122 in an annulus between the casings 120 and 122 and the drillhole 104. The cement 130, for example, may secure the casings 120 and 122 (and any other casings or liners of the drillhole 104) through the subterranean layers under the terranean surface 102. In some aspects, the cement 130 may be installed along the entire length of the casings (e.g., casings 120 and 122 and any other casings), or the cement 130 could be used along certain portions of the casings if adequate for a particular drillhole 104. The cement 130 can also provide an additional layer of confinement for the hazardous material in canisters 126.

The drillhole 104 and associated casings 120 and 122 may be formed with various example dimensions and at various example depths (e.g., true vertical depth, or TVD). For instance, a conductor casing (not shown) may extend down to about 120 feet TVD, with a diameter of between about 28 in. and 60 in. The surface casing 120 may extend down to about 2500 feet TVD, with a diameter of between about 22 in. and 48 in. An intermediate casing (not shown) between the surface casing 120 and production casing 122 may extend down to about 8000 feet TVD, with a diameter of between about 16 in. and 36 in. The production casing 122 may extend inclinedly (e.g., to case the horizontal portion 110) with a diameter of between about 11 in. and 22 in. The foregoing dimensions are merely provided as examples and other dimensions (e.g., diameters, TVDs, lengths) are contemplated by the present disclosure. For example, diameters and TVDs may depend on the particular geological composition of one or more of the multiple subterranean layers (112, 114, 116, and 118), particular drilling techniques, as well as a size, shape, or design of a hazardous material canister 126 that contains hazardous material to be deposited in the hazardous waste repository 100. In some alternative examples, the production casing 122 (or other casing in the drillhole 104) could be circular in cross-section, elliptical in cross-section, or some other shape.

As illustrated, the vertical portion 106 of the drillhole 104 extends through subterranean layers 112, 114, and 116, and, in this example, lands in a subterranean layer 118. As discussed above, the surface layer 112 may or may not include mobile water. In this example, a mobile water layer 114 is below the surface layer 112 (although surface layer 112 may also include one or more sources of mobile water or liquid). For instance, mobile water layer 114 may include one or more sources of mobile water, such as freshwater aquifers, salt water or brine, or other source of mobile water. In this example of hazardous waste repository 100, mobile water may be water that moves through a subterranean layer based on a pressure differential across all or a part of the subterranean layer. For example, the mobile water layer 114 may be a permeable geologic formation in which water freely moves (e.g., due to pressure differences or otherwise) within the layer 114. In some aspects, the mobile water layer 114 may be a primary source of human-consumable water in a particular geographic area. Examples of rock formations of which the mobile water layer 114 may be composed include porous sandstones and limestones, among other formations.

Other illustrated layers, such as the impermeable layer 116 and the storage layer 118, may include immobile water. Immobile water, in some aspects, is water (e.g., fresh, salt, brine), that is not fit for human or animal consumption, or both. Immobile water, in some aspects, may be water that, by its motion through the layers 116 or 118 (or both), cannot reach the mobile water layer 114, terranean surface 102, or both, within 10,000 years or more (such as to 1,000,000 years).

Below the mobile water layer 114, in this example implementation of hazardous waste repository 100, is an impermeable layer 116. The impermeable layer 116, in this example, may not allow mobile water to pass through. Thus, relative to the mobile water layer 114, the impermeable layer 116 may have low permeability, e.g., on the order of nanodarcy permeability. Additionally, in this example, the impermeable layer 116 may be a relatively non-ductile (i.e., brittle) geologic formation. One measure of non-ductility is brittleness, which is the ratio of compressive stress to tensile strength. In some examples, the brittleness of the impermeable layer 116 may be between about 20 MPa and 40 MPa.

As shown in this example, the impermeable layer 116 is shallower (e.g., closer to the terranean surface 102) than the storage layer 118. In this example rock formations of which the impermeable layer 116 may be composed include, for example, certain kinds of sandstone, mudstone, clay, and slate that exhibit permeability and brittleness properties as described above. In alternative examples, the impermeable layer 116 may be deeper (e.g., further from the terranean surface 102) than the storage layer 118. In such alternative examples, the impermeable layer 116 may be composed of an igneous rock, such as granite.

Below the impermeable layer 116 is the storage layer 118. The storage layer 118, in this example, may be chosen as the landing for the horizontal portion 110, which stores the hazardous material, for several reasons. Relative to the impermeable layer 116 or other layers, the storage layer 118 may be thick, e.g., between about 100 and 200 feet of total vertical thickness. Thickness of the storage layer 118 may allow for easier landing and directional drilling, thereby allowing the horizontal portion 110 to be readily emplaced within the storage layer 118 during constructions (e.g., drilling). If formed through an approximate horizontal center of the storage layer 118, the horizontal portion 110 may be surrounded by about 50 to 100 feet of the geologic formation that comprises the storage layer 118. Further, the storage layer 118 may also have only immobile water, e.g., due to a very low permeability of the layer 118 (e.g., on the order of milli- or nanodarcys). In addition, the storage layer 118 may have sufficient ductility, such that a brittleness of the rock formation that comprises the layer 118 is between about 3 MPa and 10 MPa. Examples of rock formations of which the storage layer 118 may be composed include shale, salt, and anhydrite (among others). Further, in some aspects, hazardous material may be stored below the storage layer, even in a permeable formation such as sandstone or limestone, if the storage layer is of sufficient geologic properties to isolate the permeable layer from the mobile water layer 114.

In some aspects, the layer 118 may have properties suitable for a long-term confinement of nuclear waste, and for its isolation from a mobile water layer (e.g., aquifers) and a terranean surface. Such formations may be found relatively deep in the Earth, typically 3000 feet or greater, and placed in isolation below any fresh water aquifers. For instance, the appropriate formation may include geologic properties that enhance the long-term (e.g., thousands of years) isolation of material. Such properties, for instance, have been illustrated through the long term storage (e.g., tens of millions of years) of hydrocarbon fluids (e.g., gas, liquid, mixed phase fluid) without escape of substantial fractions of such fluids into surrounding layers (e.g., mobile water layer).

For example, shale has been shown to hold natural gas for millions of years or more, giving it a proven capability for long-term storage of hazardous material. Example shale formations (e.g., Marcellus, Eagle Ford, Barnett, and otherwise) has stratification that contains many redundant sealing layers that have been effective in preventing movement of water, oil, and gas for millions of years, lacks mobile water, and can be expected (e.g., based on geological considerations) to seal hazardous material (e.g., fluids or solids) for thousands of years after deposit. In some aspects, the formation may form a leakage barrier, or barrier layer to fluid leakage that may be determined, at least in part, by the evidence of the storage capacity of the layer for hydrocarbons or other fluids (e.g., carbon dioxide) for hundreds of years, thousands of years, tens of thousands of years, hundreds of thousands of years, or even millions of years.

Another particular quality of shale that may advantageously lend itself to hazardous material storage is its clay content, which, in some aspects, provides a measure of ductility greater than that found in other, impermeable rock formations. For example, shale may be stratified, made up of thinly alternating layers of clays (e.g., between about 20-30% clay by volume) and other minerals. Such a composition may make shale less brittle and, thus less susceptible to fracturing (e.g., naturally or otherwise) as compared to rock formations in the impermeable layer (e.g., dolomite or otherwise). For example, rock formations in the impermeable layer may have suitable permeability for the long term storage of hazardous material, but are too brittle and commonly are fractured. Thus, such formations may not have sufficient sealing qualities (as evidenced through their geologic properties) for the long term storage of hazardous material.

In some aspects, the formation of the storage layer 118 and/or the impermeable layer 116 may form a leakage barrier, or barrier layer to fluid leakage that may be determined, at least in part, by the evidence of the storage capacity of the layer for hydrocarbons or other fluids (e.g., carbon dioxide) for hundreds of years, thousands of years, tens of thousands of years, hundreds of thousands of years, or even millions of years. For example, the barrier layer of the storage layer 118 and/or impermeable layer 116 may be defined by a time constant for leakage of the hazardous material more than 10,000 years (such as between about 10,000 years and 1,000,000 years) based on such evidence of hydrocarbon or other fluid storage.

The present disclosure contemplates that there may be many other layers between or among the illustrated subterranean layers 112, 114, 116, and 118. For example, there may be repeating patterns (e.g., vertically), of one or more of the mobile water layer 114, impermeable layer 116, and storage layer 118. Further, in some instances, the storage layer 118 may be directly adjacent (e.g., vertically) the mobile water layer 114, i.e., without an intervening impermeable layer 116. In some examples, all or portions of the radiussed drillhole 108 and the horizontal drillhole 110 may be formed below the storage layer 118, such that the storage layer 118 (e.g., shale or other geologic formation with characteristics as described herein) is vertically positioned between the horizontal drillhole 110 and the mobile water layer 114.

In this example, the horizontal portion 110 of the drillhole 104 includes a storage area in a distal part of the portion 110 into which hazardous material may be retrievably placed for long-term storage. For example, a work string (e.g., tubing, coiled tubing, wireline, or otherwise) or other downhole conveyance (e.g., tractor) may be moved into the cased drillhole 104 to place one or more (three shown but there may be more or less) hazardous material canisters 126 into long term, but in some aspects, retrievable, storage in the portion 110.

Each canister 126 may enclose hazardous material (shown as material 145). Such hazardous material, in some examples, may be biological or chemical waste or other biological or chemical hazardous material. In some examples, the hazardous material may include nuclear material, such as SNF recovered from a nuclear reactor (e.g., commercial power or test reactor) or military nuclear material. Spent nuclear fuel, in the form of nuclear fuel pellets, may be taken from the reactor and not modified. Nuclear fuel pellet are solid, although they can contain and emit a variety of radioactive gases including tritium (13 year half-life), krypton-85 (10.8 year half-life), and carbon dioxide containing C-14 (5730 year half-life). Other hazardous material 145 may include, for example, radioactive liquid, such as radioactive water from a commercial power (or other) reactor.

In some aspects, the storage layer 118 should be able to contain any radioactive output (e.g., gases) within the layer 118, even if such output escapes the canisters 126. For example, the storage layer 118 may be selected based on diffusion times of radioactive output through the layer 118. For example, a minimum diffusion time of radioactive output escaping the storage layer 118 may be set at, for example, fifty times a half-life for any particular component of the nuclear fuel pellets. Fifty half-lives as a minimum diffusion time would reduce an amount of radioactive output by a factor of $1 \times 10^{15}$. As another example, setting a minimum diffusion time to thirty half-lives would reduce an amount of radioactive output by a factor of one billion.

For example, plutonium-239 is often considered a dangerous waste product in SNF because of its long half-life of 24,100 years. For this isotope, 50 half-lives would be 1.2 million years. Plutonium-239 has low solubility in water, is not volatile, and as a solid, its diffusion time is exceedingly small (e.g., many millions of years) through a matrix of the rock formation that comprises the illustrated storage layer 118 (e.g., shale or other formation). The storage layer 118, for example comprised of shale, may offer the capability to have such isolation times (e.g., millions of years) as shown by the geological history of containing gaseous hydrocarbons (e.g., methane and otherwise) for several million years. In contrast, in conventional nuclear material storage methods, there was a danger that some plutonium might dissolve in a layer that comprised mobile ground water upon confinement escape.

In some aspects, the drillhole 104 may be formed for the primary purpose of long-term storage of hazardous materials. In alternative aspects, the drillhole 104 may have been previously formed for the primary purpose of hydrocarbon production (e.g., oil, gas). For example, storage layer 118 may be a hydrocarbon bearing formation from which hydrocarbons were produced into the drillhole 104 and to the terranean surface 102. In some aspects, the storage layer 118 may have been hydraulically fractured prior to hydrocarbon production. Further in some aspects, the production casing 122 may have been perforated prior to hydraulic fracturing. In such aspects, the production casing 122 may be patched (e.g., cemented) to repair any holes made from the perforating process prior to a deposit operation of hazardous material. In addition, any cracks or openings in the cement between the casing and the drillhole can also be filled at that time.

As shown in this example, a drillhole seal 134a, such as a plug, packer, or other seal, is positioned in the vertical portion 106 of the directional drillhole 104. In some aspects, the drillhole seal 134a may prevent or help prevent hazardous waste stored in the canisters 126, or solids or fluids released by the hazardous waste in the canisters 126, from moving through the vertical portion 106 toward the terranean surface 102 from the horizontal portion 110. As further shown in this example implementation, the drillhole seal 134a is placed in the vertical drillhole portion 106, while the drillhole seal 134b is placed in the horizontal drillhole portion 110. Although two drillhole seals 134a and 134b are shown, more or fewer drillhole seals according to the present disclosure may be positioned in the hazardous waste repository 100. Further, in some aspects, both drillhole seals 134a and 134b (and others is applicable) may be positioned in the vertical drillhole portion 106. Alternatively, both drillhole seals 134a and 134b (and others is applicable) may be positioned in the horizontal drillhole portion 110. In some aspects, one or more drillhole seals (such as 134a or 134b) may be positioned in the transition drillhole portion 108. In some aspects, two or more drillhole seals (such as 134a and 134b) may be positioned in contact with each other in the directional drillhole 104.

In some aspects, one or more of the previously described components of the repository 100 may combine to form an engineered barrier of the hazardous waste material repository 100. For example, in some aspects, the engineered barrier is comprised of one, some, or all of the following components: the storage layer 118, the casing 122, the canister 126, the seal 134, and the hazardous material 145, itself. In some aspects, one or more of the engineered barrier components may act (or be engineered to act) to: prevent or reduce corrosion in the drillhole 104, prevent or reduce escape of the hazardous material 145; reduce or prevent thermal degradation of one or more of the other components; and other safety measures to ensure that the hazardous material 145 does not reach the mobile water layer 114 (or surface layer 112, including the terranean surface 102).

Figure 2:
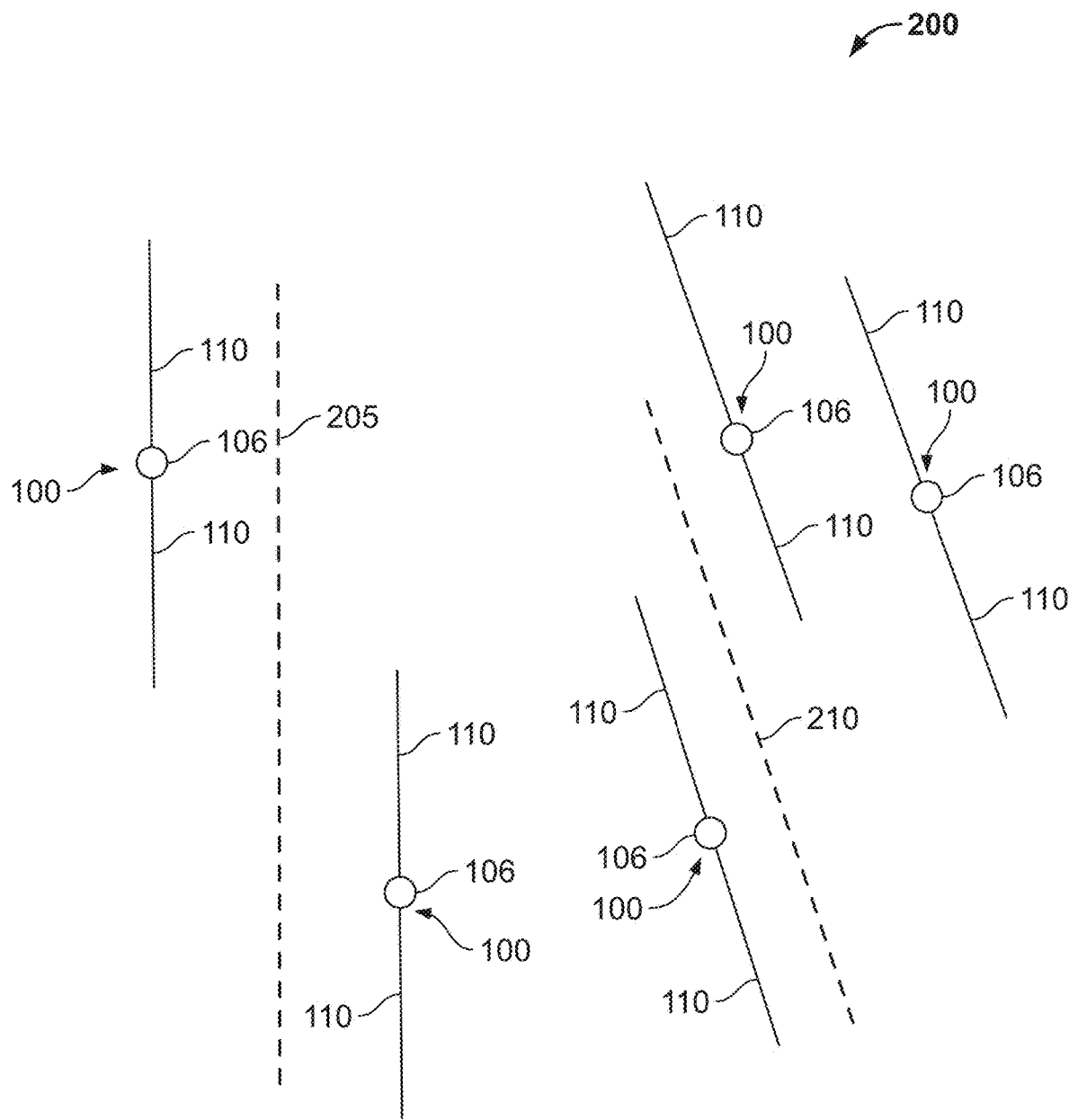
FIG. 2 is a schematic top view of an example implementation of a hazardous waste repository system formed in one or more subterranean formations that include one or more faults.

FIG. 2 is a schematic top view of an example implementation of a hazardous waste repository system 200 formed in one or more subterranean formations that include one or more faults (205 and 210). For example, the hazardous waste repository system 200 may include one or several hazardous waste repository 100. In this example, each hazardous waste repository 100 includes two horizontal drillhole portions 110 (e.g., in which hazardous waste, such as nuclear waste, is stored in hazardous waste canisters 126) that are each coupled to a single vertical drillhole portion 106. In other examples, there may be more or fewer hazardous waste repositories 100, and each hazardous waste repository 100 may have a 1:1 ratio of vertical drillhole portions 106 to horizontal drillhole portions 110. As shown in this example, one or more faults 205 and 210 are present. Each fault 205 and 210 may extend through a single subterranean formation (e.g., formation 114, or formation 116, or formation 118). Alternatively, in some cases, such faults 205 and 210 may extend through multiple subterranean formations (e.g., subterranean formations 116 and 118).

In some aspects, the faults 205 or 210 may be present (e.g., naturally) in a particular subterranean formation (e.g., layer 118) in which the horizontal drillhole portion 110 that stores the hazardous waste is formed. Due to such naturally occurring faults 205 or 210, conventionally, underground disposal (e.g., in deep, human-unoccupiable directional drillholes) of nuclear waste (e.g., spent nuclear fuel or high level waste) cannot be done safely in regions in which faults occur due to likely seismic activity (e.g., earthquakes) associated with these faults 205 or 210. Since some nuclear waste is generated in regions that have large and frequent earthquakes (e.g., nuclear waste from commercial nuclear reactors in California, Taiwan, South Korea, and Japan to name a few), that assumption requires a distant location for disposal. Distant disposal can create legal issues (some countries are mandated to dispose within the country) and real or perceived risks from transportation.

In some aspects, the shaking caused by a nearby earthquake is not the primary danger to the nuclear waste canisters 126 positioned in a hazardous waste repository of the deep directional drillhole 104 formed in the subterranean formation 118 (in this example). The reason is that such accelerations are typically less than 1 g (i.e., less than 980 gal, where a gal is the standard unit for acceleration, equal to 1 cm per second per second). Such accelerations present threats to surface structures, but the nuclear waste canisters 126, in some aspects, may be designed to endure much stronger accelerations.

Rock at a depth of the subterranean formation 118, for example, when accessed by the directional drillhole 110, typically has a stress tensor measured by using standard geophysical techniques. Deep horizontal wellbores for hydraulic fracturing and extraction of oil and gas are typically drilled in the direction of maximum rock stress. For example, horizontal wellbores used to access regions of shale gas and/or shale oil extend in a direction of maximum horizontal stress in the rock layer through which such wellbores are formed. In the locations where an angle of the horizontal drillhole deviates from the direction of maximum horizontal stress, it does so because for that local rock, the direction of maximum stress changes.

For example, in hydrocarbon recovery from shale, orientation along the direction of maximum horizontal stress is done because doing so is usually optimum for the process of hydraulic fracturing. In hydraulic fracturing, a series of perforations is made in the casing along its length in the horizontal section. High pressure water and sand is then pumped into the casing and out through the holes to fracture the rock. Under this pressure, the rock tends to fracture in the direction perpendicular to the drillhole. The desired outcome is a set of fracture planes that are perpendicular to the drillhole, so that when many holes are fractured, these fractures will be spread throughout a large volume of the target shale rock. If the fractures were parallel to the drillhole, then they would overlap, and a much smaller volume would be covered.

For the underground disposal or storage of radioactive waste (e.g., SNF or high level waste), conventionally, orientation of any wellbore or human-occupiable underground repository was selected in an arbitrary direction without regard for, e.g., maximum horizontal stress of the rock layer or direction of faults therethrough. Arbitrary drillhole orientations of the horizontal drillhole portion 110 (e.g., relative to the vertical drillhole portion 106) may be acceptable, and in some cases useful, but they may also present a danger in a subterranean formation that is susceptible to seismic events, such as earthquakes. If a fault slips, that is, if the rock on one side of the fault moves with respect to the other side, and this fault crosses the hazardous waste repository section of the directional drillhole 104, then that slippage could break the continuity of the drillhole 104, could possible break one or more nuclear waste canisters 126 that is in horizontal drillhole portion 110, and at the same time create a path to the terranean surface 102 that would allow fluid, including gases and liquids, to reach the surface from the disposal section in an unacceptably short time.

The hazardous waste repository system 200 shown in FIG. 2 is an example implementation of one or more hazardous waste repositories 100 formed in one or more subterranean formations in regions where earthquakes are frequent and/or likely to occur in the future. As described with respect to FIG. 1, the horizontal drillhole portions 110 may be formed in or under a subterranean formation (e.g., layer 118) that is or includes an impervious or impermeable seal to the transmission of fluid (e.g., liquid or gas) therethrough. For example, the formation may be shale, salt, clay, or other type of rock.

As shown in this example, in the hazardous waste repository system 200, each of the horizontal drillhole portions 110 of the hazardous waste repositories 100 are oriented parallel to the particular fault 205 or 210 that extends through the same subterranean formation as the drillhole portions 110. For example, in some aspects, the horizontal (or nearly horizontal) drillholes 110 may achieve a greater safety against accidental rupture from earthquake faults 205 or 210 if such drillhole 110 are aligned perpendicular to the direction of maximum horizontal stress (that is, parallel to the faults 205 or 210). Thus, the hazardous waste repository system 200 includes horizontal drillhole portions 110 that are parallel to a direction in which a fracture caused by a seismic event is most likely to occur, either from extension of an existing fault 205 or 210 (which may or may not be known to geologists) or from the creation of a new fault during the earthquake or other seismic event. This orientation may significantly reduce the likelihood that an earthquake-induced fracture will cross the hazardous waste repository area of the deep directional drillhole 104.

In an example operation, a particular subterranean formation (e.g., storage layer 118) may be determined as being suitable as a hazardous waste repository. For example, the particular subterranean formation may be suitable based on, e.g., one or more geologic parameters (e.g., permeability, ductility, brittleness), one or more test results on a liquid (e.g., brine) found in the subterranean formation, geographic location, or other criteria. The suitability of the particular subterranean formation as a hazardous waste repository may be, for example, its ability to sealingly store nuclear waste for a long period of time (e.g., tens of years, hundreds of years, thousands of years, tens of thousands of years).

In a next step, a determination is made of whether one or more faults extend through the particular subterranean formation and, if so, where such fault (or faults) extend. For example, in some aspects, faults may be located (and known) from seismic records. In some aspects, faults may be identified from seismic reflection surveys (showing discontinuities in competent strata) or through geologic mapping. In some aspects, indirect methods, e.g., detection of methane leaks, might detect faults at a terranean surface, such as if the fault is hydraulically conducting. In some aspects, electromagnetic (EM) surveys may also diagnose fault locations.

As further examples, faults may be known or determined since many faults occur in conjugate planes. For example, while the Hayward fault zone in California is a known fault, there are also faults at an acute (e.g., not quite 90 degrees) angle to the Hayward fault that can also create earthquakes. Thus, in some aspects, deep directional drillholes may be formed that are parallel to known (and the riskiest) faults while still intersecting other (less risky) faults. As another example, Taiwan is at an example of a collision margin (e.g., convergent margin where tectonic plates are moving toward each other). Thus, in this area, most of the faults are thrust and reverse with fault planes oriented in the collision direction.

Relatedly, a stress tensor of the rock at depth can be determined using the geophysical techniques that are used in the oil and gas technology. However, even before drilling, it can be estimated by mapping of nearby faults. In a region that has a stress tensor that varies only slowly over location, the earthquake faults will be parallel, and thus mapping gives the desired direction.

In a next step, a directional drillhole (e.g., a vertical portion, radius portion, and horizontal portion) may be formed and oriented parallel to the determined one or more faults without any intersection between the drillhole and the fault(s). The hazardous waste repository is then formed in, e.g., the horizontal portion of the directional drillhole and hazardous waste (e.g., radioactive waste) is emplaced therein. In some aspects, in an area that has nearby faults, an optimum location for a deep directional drillhole may be between two parallel faults and originated in the same direction as the faults. Thus, neither of these faults intersects the hazardous waste repository area of a deep directional drillhole, nor would such faults intersect the hazardous waste repository area if an earthquake lengthened the faults. In some aspects, the existence of these faults provides a relief for stress that could build in the rock; stress that, in the absence of these existing faults, might create a new fault.

Figure 3:
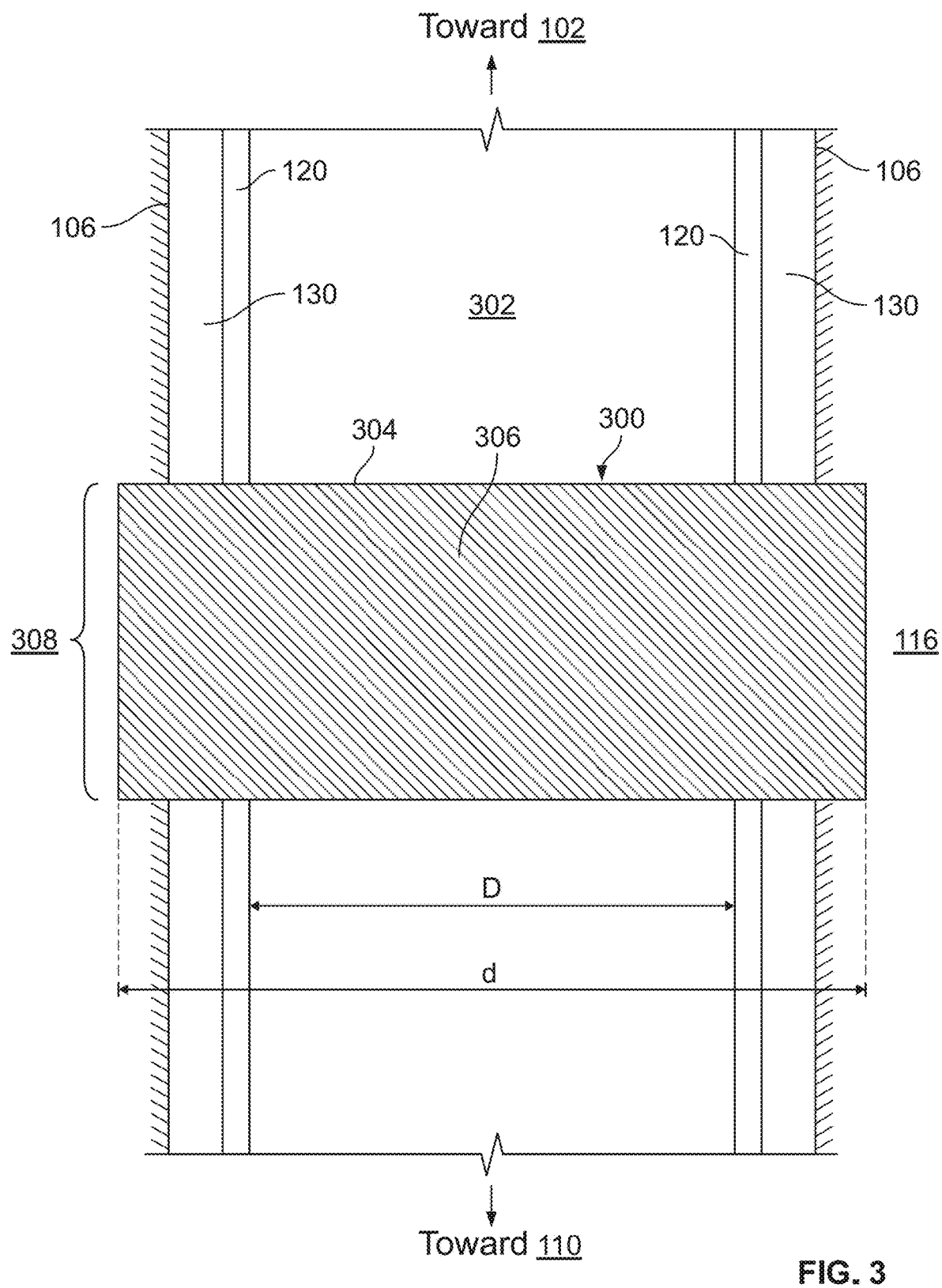
FIG. 3 is a schematic illustration of an example implementation of a drillhole seal for a hazardous waste repository according to the present disclosure.

FIG. 3 is a schematic illustration of an example implementation of a drillhole seal 300 for a hazardous waste repository, such as hazardous waste repository 100 shown in FIG. 1. In some aspects, the drillhole seal 300 may be used as one or both of drillhole seals 134a or 134b in the repository 100. As shown in the example implementation of FIG. 1, for example, drillhole seal 134a is positioned in the vertical drillhole portion 106. In some aspects, when a drillhole (or wellbore), such as drillhole portion 106, is created, there is typically a "disturbed zone" that circumscribes the created drillhole, often extending into the rock layer a distance roughly equal to the radius of the drillhole. This disturbed zone provides a potential pathway for the waste (such as hazardous waste 145 if leaked from canisters 126) to be carried to the terranean surface 102 by, e.g., flowing water and brine. Another possible leakage path is in the space 302 (e.g., annulus 302) between a casing (e.g., the casing 120) and the rock formation (e.g., formations 112 through 118 and others) through which the drillhole 104 extends. For some drillholes, the annulus 302 is filled with cement. The capability to prevent leakage in this location is related, in some aspects, to the lifetime of the cement.

The drillhole seal 300, as shown in FIG. 3, is placed in the vertical drillhole portion 106 of the deep directional drillhole 104 (e.g., a human-unoccupiable drillhole) that includes or is part of the hazardous waste repository 100. In some aspects, the seal 300 (also called a plug) may utilize a geologic formation property called "creep," which may advantageously be utilized to seal the vertical drillhole portion 106 (in this example). Creep occurs, for example, in shale, in clay, in salt, and other rocks. Creep, generally, is a slow flow of the rock that tends to fill cracks and other discontinuities. In the example implementation shown in FIG. 3, the seal 300 includes one or more rock portions made of particular rocks (or a particular rock) that exhibits creep.

As shown in FIG. 3 (and also with reference to components shown in FIG. 1), the drillhole seal 300 includes a frame or housing 304 that at least partially encloses a rock (or other natural) material 306. The rock material 306, in some aspects, is shale, or clay, or salt, or other rock material that exhibits creep. In some aspects, the frame or housing 304 is at least partially open to the annulus 302, the subterranean formation 116, or both. Thus, in some aspects, as the rock material 306 exhibits creep, the material 306 may move to fill in spaces between the frame 304 and, e.g., the formation 116 (e.g., fill in all or part of a disturbed zone around the vertical drillhole portion 106).

In this example, a diameter, d, of the drillhole seal 300 is larger than a diameter, D, of the casing 120. Thus, in this example, a milled portion 308 of the casing 120 (and cement 130 and perhaps the formation 116) may be removed prior to installation of the drillhole seal 300 in the vertical drillhole portion 106. In such aspects, an expandable portion of the drillhole seal 300 (not shown), such as a packer-type device, may be expanded to adjust the drillhole seal 300 into the milled portion 308. In alternative aspects, the diameter, d, of the drillhole seal 300 may be less than the diameter, D, of the casing 120. In such aspects as well, an expandable portion of the drillhole seal 300 (not shown), such as a packer-type device, may be expanded to adjust the drillhole seal 300 to contact the casing 120. In alternative aspects, the diameter, d, of the drillhole seal 300 may be equal to or approximately equal to the diameter, D, of the casing 120.

The example implementation of the drillhole seal 300 can be used at a rock layer that is similar in composition to the rock material 306 (e.g., shale, clay, salt, or other rock), but it can also be used at other layers (e.g., rock layers made of limestone or basalt) that are dissimilar to the rock material 306. In some aspects, the rock material 306 could be obtained from the drillhole 104 itself; if more material 306 is needed (e.g., for multiple drillhole seals 300), then such material 306 could be brought in from another location.

In some aspects, salt can also be used for the rock material 306 in the seal 300. For example, salt has the property that local water can dissolve it, and that could help move it into the damaged zone (e.g., adjacent the milled portion 308) to help seal the damaged zone that circumscribes the drillhole portion 106. However, in some aspects, care must be taken to assure that any salt not be vulnerable to dissolution by deep brines. An indicator of safety against dissolution would be if those brines are already saturated with salt.

In another example implementation, the rock material 306 may be comprised of multiple types of rock, at least one of which exhibiting the property of creep. Some of these types of rock material 306 may match the rock layer, e.g., in the subterranean formation 116, thus making the hole filled be similar at depth to the pre-existing rock. The rock material 306 of the seal 300 may not be identical to the subterranean formation 116, since the rock in the layer 116 will be solid, although perhaps cracked in the disturbed zone, but the rock material 306 in the seal 300 may consist of smaller pieces in order to be put in place. In some aspects, matching the rock type at depth may provide a more continuous seal that would otherwise be available with a conventional hydrocarbon operations seal (e.g., bridge plug, packer, or otherwise). In addition, in some aspects, the drillhole seal 300 may include other sealing materials, such as, for example, cement, bentonite, or other sealing material.

Although described as positioned in the vertical drillhole portion 106, the drillhole seal 300 can be used with drillholes with any orientation (or formed for other purposes). A drillhole seal 300 in accordance with this disclosure could be used, for example, to seal conventional oil and gas wells.

In an example operation, once the waste canisters have been emplaced in the directional drillhole 104, the milled portion 308 (e.g., of the casing 120 and cement 130 and possibly part of the layer 116) is optionally formed (e.g., with a reaming tool). For example, the portion of the casing 120 may be removed (e.g., milled out or otherwise cut away) to improve a secure seal between the seal 300 and the surrounding rock formation 116. In some aspects, a seal-to-casing seal may not be as secure. For example, without removing the portion of the casing 120, there is a possibility that a pathway will exist in the annulus 302 (or otherwise radially outside of the casing 120) that could convey water or brine, perhaps containing hazardous waste 145 to the terranean surface 102 or near surface (e.g., to a source of mobile water).

In some aspects, only a portion of the casing 120 in the vertical drillhole 106 is removed, as it may not be necessary to remove all of the casing 120. For example, in some aspects, the intent is to seal the vertical drillhole 106 at several locations, and not necessarily at all depths. By removing the portion of the casing 120, a disc-shaped portion with an outer diameter greater than the diameter, D, of the casing 120 (and possibly the vertical drillhole portion 106) is formed at a particular depth in the vertical drillhole portion 106.

In some aspects, the horizontal disposal repository drillhole sits underneath one or more layers of clay-rich shale, a rock that has appropriate creep properties. The vertical drillhole portion 106 may penetrate this layer. The shale (e.g., a "cap" layer) may also be self-healing and reduce fractures and other pathways that could allow gases and liquids to move quickly through the layer.

Once the portion of the casing 120 is removed, drillhole seal 300 is inserted into the vertical portion 106 of the drillhole 104 to the depth at which the casing portion is removed. As the disc-shaped volume created by the removal of the casing 120 is filled by the drillhole seal 300, the pressure of rock at shallower depths presses against the rock layer 116 over a short period of time (days to years), thereby causing creep that "heals" (e.g., fills in) small cracks and discontinuities in the disc-shaped volume (e.g., the milled portion 308). As described, the downhole seal 300 may include the frame 304 or other structure (e.g., made of a corrosion resistant material) that holds or at least partially encloses the creep material 306.

Such filling material 306 is not standard for sealing holes in the oil and gas industry since a quicker seal is typically desired. For that reason, cement is frequently a component. However, implementations of the drillhole seal 300 described here provides an engineered barrier for strong isolation and protection for thousands of years by taking advantage of the process of creep to provide a better long-term seal for a hazardous waste repository.

The present disclosure also contemplates implementations of systems and methods to seal a portion (vertical portion 106, horizontal portion 110, or both) of the directional drillhole 104 that stores hazardous (e.g., nuclear) waste that include multiple drillhole seals 300 positioned in the directional drillhole 104. For example, once the waste canisters 126 have been emplaced in the directional drillhole 104, portions of the casing 120 at two or more depths are removed.

In some aspects, each drillhole seal 300 includes rock material 306 that matches the natural geologic formation at the particular depth of each seal 300, and which, from the pressure of rock above, forms a good seal with that geologic formation. In some aspects, there may be a respective drillhole seal 300 positioned in the vertical portion 106 at each different geologic formation (e.g., subterranean formations 112, 114, 116, 118) between the terranean surface 102 and a formation in which a hazardous waste repository is located (e.g., subterranean formation 118). Alternatively, there may be a respective drillhole seal 300 positioned in the vertical portion 106 at less than all of the geologic formations between the terranean surface 102 and the formation 118 in which a hazardous waste repository is located.

To install each drillhole seal 300, in this example, a portion of the casing 120 is removed as previously described. A particular drillhole seal 300 that includes a material 306 that has good creep properties and/or matches a geologic formation at a desired set-depth of the seal 300 is inserted into the vertical portion 106 of the drillhole 104 to the depth at which the casing portion is removed. As described, in this example, each seal 300 includes rock material 306 that matches the formation at a particular depth at which the seal 300 is to be set. To facilitate creep, the rock material 306 may be divided into small pieces prior to being formed into the seal 300. For example, if the space between pieces is less than 0.1 mm, then the creep time to fill the gaps is shorter than if there are gaps of several millimeters (or greater distances).

In an example implementation of this method, the rock material 306 used to fill the annulus 302 at the depth would be rock that was obtained from that layer (e.g., subterranean formation 112, 114, 116, or 118) when the drillhole 104 was originally formed. Alternatively, the rock material 306 could be rock obtained from another drillhole, or it could be rock obtained from a location in which the same geologic formation comes closer to or reaches the terranean surface 102. Thus, the rock material 306 used to form the seal 300 may have as good of a match with the geologic formation as possible to assure that over time there will be little to no unconformity between the fill and the undrilled rock.

In some aspects, there is not a seal 300 set to match every formation in the case of "layer cake" geology, i.e. geology that consists of many layers of different kinds of rock. In some aspects, there may be only one seal 300 that is set at a layer that will provide a seal against leakage.

Figure 4A:
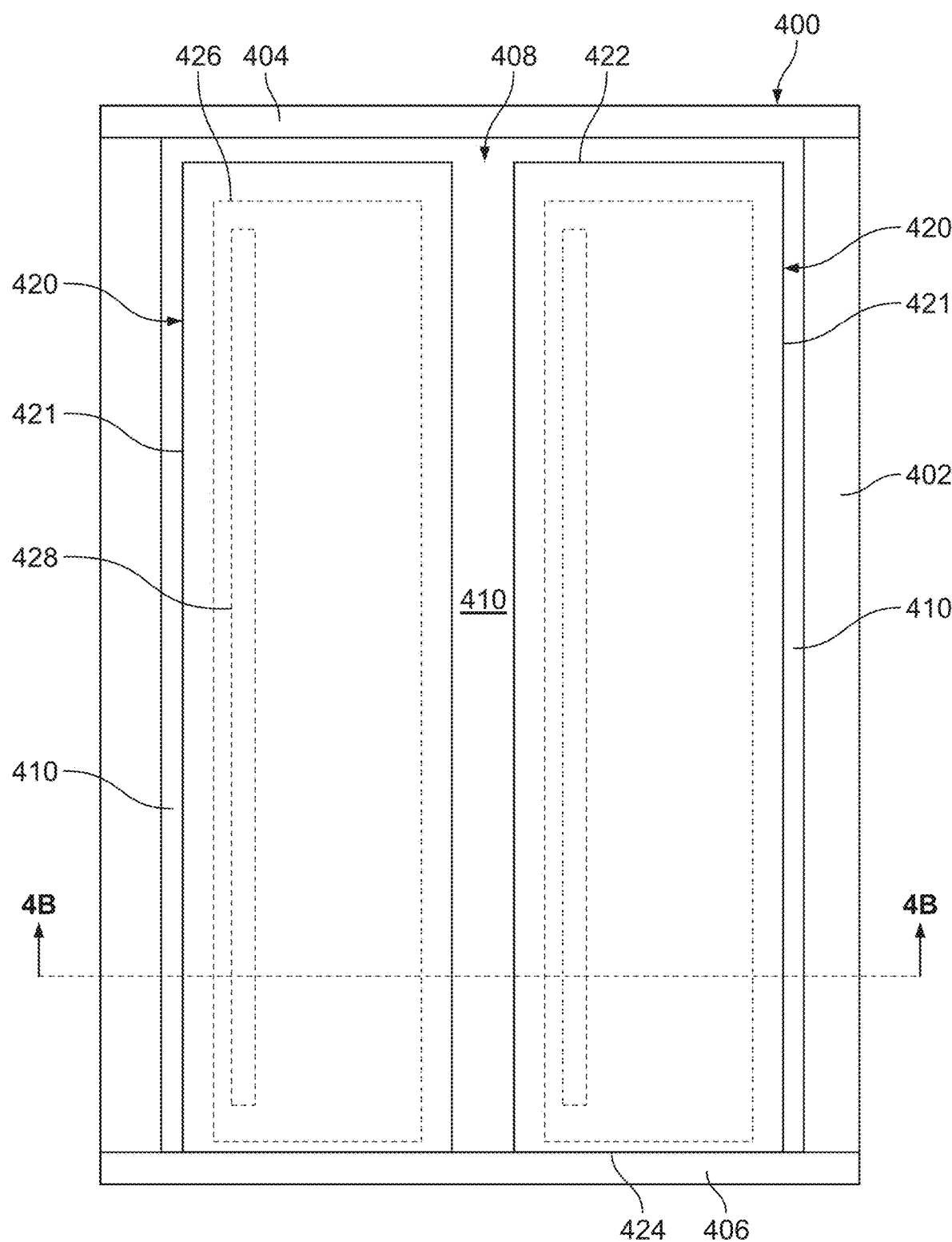
FIGS. 4A-4B are schematic illustrations of an example implementation of a nuclear waste dry cask that encloses one or more nuclear waste canisters for a hazardous waste repository according to the present disclosure.
Figure 4B:
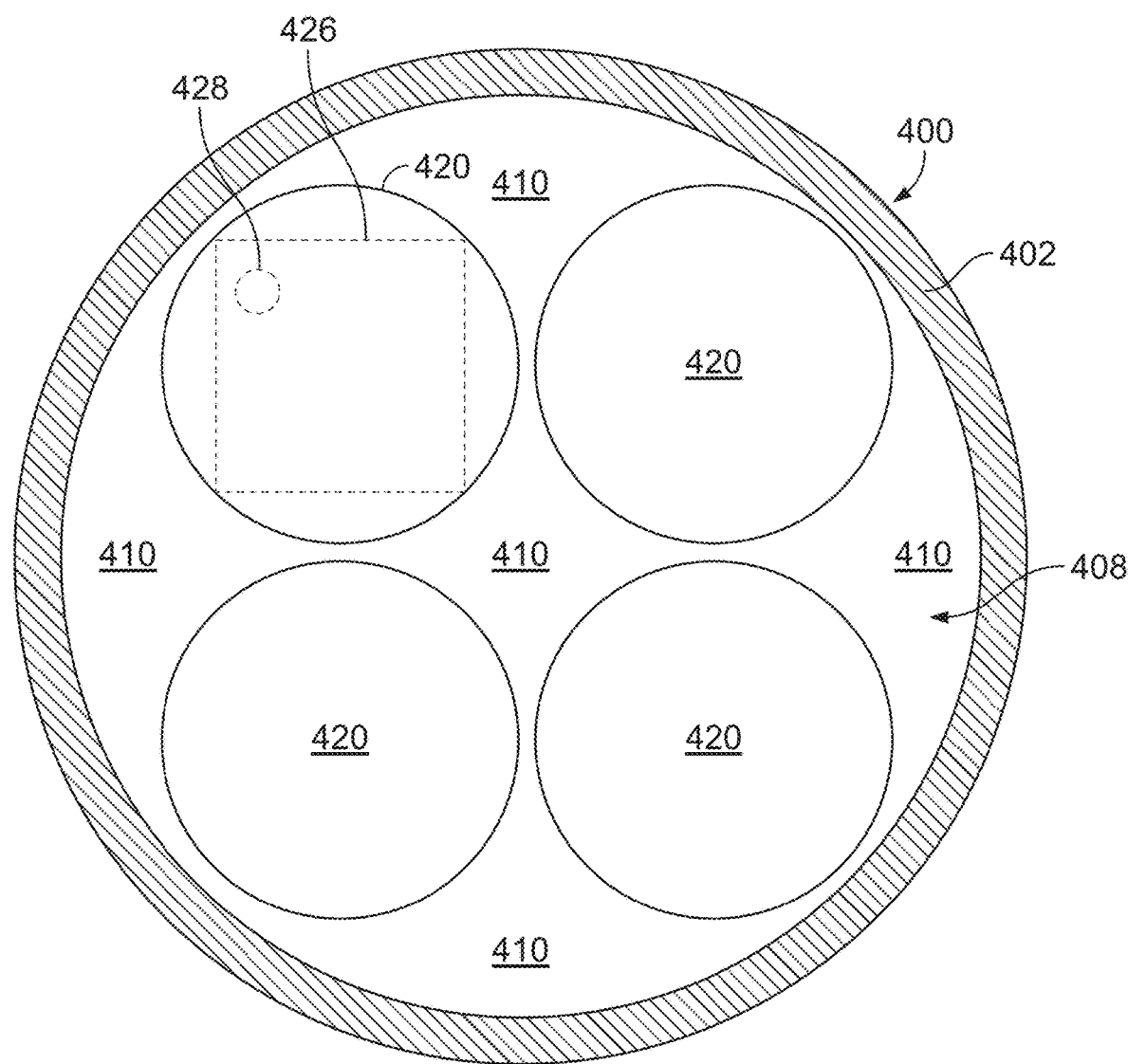

FIGS. 4A-4B are schematic illustrations of an example implementation of a nuclear waste dry cask 400 that encloses one or more nuclear waste canisters 420 for a hazardous waste repository according to the present disclosure. As shown, FIG. 4A shows a vertical cross-section of the nuclear waste dry cask 400 in which multiple nuclear waste canisters 420 are enclosed. FIG. 4B shows a radial cross-section taken from FIG. 4A. Generally, the nuclear waste dry cask 400 may enclose and store, for a transient amount of time, nuclear waste, such as SNF or high level waste. For instance, after spending several years in a cooling pool, nuclear waste in the form of SNF assemblies may be moved to "dry cask" storage. Currently, about one-third of the SNF inventory in the United States is in such storage, but that fraction is expected to grow rapidly. A conventional SNF assemblies is typically a rectangular solid in shape, between 8 to 12 inches wide (diagonal dimension of square cross section), and 14 feet long. In some aspects, thirty-six or more of the SNF assemblies are placed in a conventional canister (with a diameter of about 5 feet). The canister is filled with helium gas (to distribute heat generated by the assemblies), sealed, and placed inside a conventional concrete cask. A conventional cask may have walls that are typically 2 feet thick, which provide radiation (e.g., gamma ray) shielding for people in the vicinity of the cask. Air is circulated around the large canister (within the dry cask) to provide cooling.

Conventional dry cask storage is designed (and licensed) for temporary storage. For permanent storage, the top concrete lid is removed, the canister weld broken, and the SNF assemblies lifted out and placed in disposal canisters. These steps must be done either under water or in a "hot cell" (e.g., a room certified for handing nuclear material) since the fuel assemblies can emit gases and other radioactive material.

Example implementations of the nuclear waste dry cask 400 facilitates transfer of one or more nuclear waste canisters 420 (that may be circular, square, rectangular, or other shape in cross-section) that are stored in the nuclear waste dry cask 400 into permanent disposal (e.g., for hundreds if not thousands of years) in a deep, human-unoccupiable directional drillhole (such as drillhole 104 shown in the hazardous waste repository 100 in FIG. 1). In some aspects, nuclear waste 426, shown as an example in one of the canisters 426, is SNF in one or more SNF assembles that are formed from multiple SNF rods 428. As shown in FIGS. 4A-4B, nuclear waste 426 may represent a single SNF assembly with multiple rods 428 (however, other example implementations of the nuclear waste canister 426 may store multiple SNF assembles or even just a portion of a single SNF assembly). Other implementations of the nuclear waste dry cask 400 may store high level nuclear waste.

In this example implementation, each nuclear waste canister 420 includes a housing 421 to which a lid 422 and bottom 424 are sealed (e.g., subsequent to emplacement of the nuclear waste 426). In some aspects, the example implementations include the loading of SNF assemblies 426 in individual nuclear waste canisters 420 (i.e., each SNF assembly 426 is loaded into a single canister 420 and each canister 420 is sized to enclose a single SNF assembly 426). In some aspects, the nuclear waste canister 420 may include radiation shielding (e.g., for gamma ray or X-ray radiation) around (or as part of) the circumferential housing 421 of the canister 420 (e.g., from and between lid 422 to bottom 424) but not at (or as part of) the lid 422 or bottom 424 of the canister 420. Multiple canisters 420 may then be loaded into the nuclear waste dry cask 400. Thus, in this example implementation of the nuclear waste dry cask 400, a single large canister that holds many (e.g., 36) SNF assemblies is not placed into the nuclear waste dry cask 400 but instead, multiple SNF canisters 420 are loaded into the nuclear waste dry cask 400. Once loaded, individual SNF canisters 420 can later be removed without the need for a hot cell or a cooling pool. The canisters 420 are sealed and prevent leakage of radioactive material (such as the SNF assemblies 426).

As shown in FIG. 4A, the nuclear waste dry cask 400 includes a top 404 and a bottom 406 that connect with a housing 402 to define an inner volume 408 into which the nuclear waste canisters 420 may be emplaced. One or more cooling fluid flow paths 410 may be defined in the volume 408 through which a cooling medium (e.g., airflow, liquid coolant, or otherwise) is circulated to remove heat from the nuclear waste canisters 420. Further, one or both of the top 404 or bottom 406 may be moveable to expose the volume 408 to an environment external to the nuclear waste dry cask 400. In some aspects, one or both of the top 404 or bottom 406 is moveable without fully detaching the top 404 or bottom 406 from the housing 402, such as through a hinge between the top 404 or bottom 406 and the housing 402. Alternatively, one or both of the top 404 or bottom 406 may radially pivot (e.g., in an arc) about a pivot connection with the housing 402 to swing and expose the volume 408 to the environment.

In this example implementation, each of the top 404, the bottom 406, and the housing 402 of the nuclear waste dry cask 400 includes or is comprised of radiation (e.g., gamma ray) shielding sufficient to protect, e.g., humans in an area near the cask 400, from such radiation. In some aspects, the top 404, bottom 406, and housing 402 include or are made of concrete of a sufficient thickness to provide such radiation shielding. Alternatively, the top 404, bottom 406, and housing 402 include or are made of another shielding material, such as tungsten, of a sufficient thickness to provide such radiation shielding. In some aspects, a thickness of tungsten (as a non-cementitious material example) sufficient for radiation shielding is less than, and perhaps orders of magnitude less than, a thickness of concrete sufficient for radiation shielding.

As noted, in some aspects, each SNF canister 420 does not provide or excludes radiation shielding from the gamma rays except at the lid 422 and bottom 424. When the SNF canisters 420 are removed from the nuclear waste dry cask 400, the canisters 420, in some aspects, be inserted into a smaller concrete shield or lowered directly into a vertical entrance of the deep directional drillhole 104. For example, when inserting the nuclear waste canisters 420 stored in the nuclear waste dry cask 400 into the vertical entrance, the dry cask 400 may be placed above the vertical opening of the drillhole 104 (e.g., of the vertical portion 106). The bottom 406 of the dry cask 400 may be removed or moved (e.g., slid out to a side of the nuclear waste dry cask 400) to expose the inner volume 408 of the cask 400 in which the SNF canisters 420 are enclosed. The position of the dry cask 400 may be adjusted until a particular one of the SNF canisters 420 is in position above the vertical entrance of the disposal drillhole 104. The canister 420 is then lowered through the vertical entrance and ultimately to a hazardous waste repository in a horizontal drillhole portion 110 of the deep directional drillhole 104, e.g., for permanent storage. This process may be repeated, e.g., for each SNF canister 420 stored in the nuclear waste dry cask 400.

In an alternative aspect, the top 404 of the nuclear waste cask 400 is removed (e.g., completely, slid away, or rotated away) to expose the inner volume 408, and the canisters 420 are raised into a smaller transfer cask. A transfer cask, in some aspects, may be a smaller version of the nuclear waste dry cask 400 and is designed to hold, typically, one SNF canister 420 (although it could hold two or more, but less than the nuclear waste dry cask 400). The transfer cask is much smaller than the nuclear waste dry cask 400 and may contain no particular cooling system since the SNF canister 420 may be in this transfer cask only for a short period of time (e.g., relative to the nuclear waste dry cask 400). The transfer cask is then moved to the disposal drillhole 104, and the SNF canister 420 lowered into the vertical opening as described.

Thus, in some aspects, once the inner volume 408 is exposed, one or more SNF canisters 420 may be removed (e.g., lowered) from the volume 408 into a vertical entrance of a deep directional drillhole 104 (or alternatively into a transfer cask). In some aspects, no additional gamma ray shielding (besides that of the nuclear waste dry cask 400 and the individual SNF canisters 420, as described) is required or used to place the SNF canisters 420 into transfer casks or directly into the directional drillhole 104. Implementations of the nuclear waste dry cask 400 according to the present disclosure may, therefore, significantly simplify the process of transfer from dry cask temporary storage to permanent disposal in deep directional drillholes.

Figure 5A:
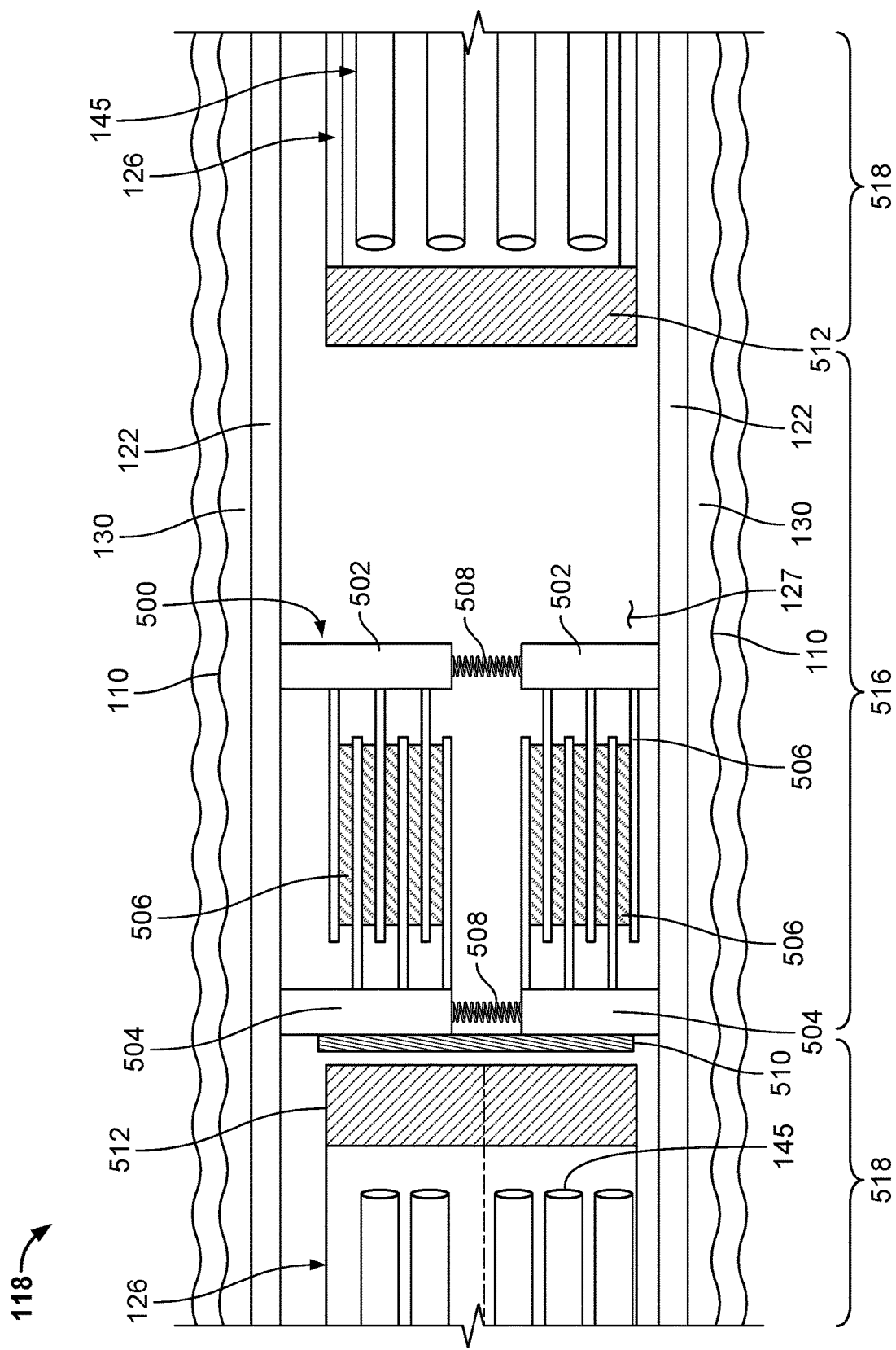
FIGS. 5A-5B are schematic illustrations of an example implementation of a power generator system for a hazardous waste repository in a directional drillhole according to the present disclosure.
Figure 5B:
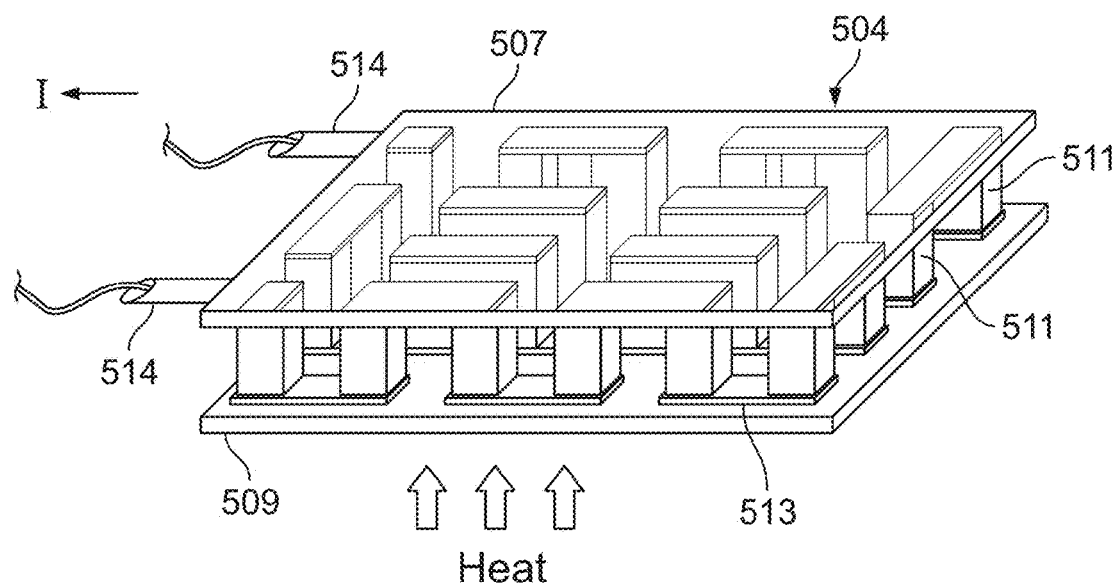

FIGS. 5A-5B are schematic illustrations of an example implementation of a power generator system 500 for a hazardous waste repository in a directional drillhole. In some aspects (and with reference to certain components described and shown in FIG. 1), when hazardous waste, such as nuclear waste (e.g., SNF or high level waste or both), is disposed underground, such as in a human-unoccupiable deep directional drillhole (e.g., in drillhole 104), there may be instruments (as all or part of a hazardous waste repository monitoring system) placed near on in contact with one or more hazardous waste canisters (e.g., canisters 126) that store the hazardous waste (e.g., hazardous waste 145). In some aspects, the instruments (e.g., to measure radiation, temperature, pressure, and other environmental conditions in or surrounding the drillhole 104) may be able to communicate to the terranean surface 102. Such communication can facilitate "performance confirmation" of the hazardous waste repository 100, e.g., as possibly required by a regulatory agency.

In some aspects, all or a part of a hazardous waste repository monitoring system (e.g., instruments, sensors, controllers, or otherwise) utilizes electrical power. Conventionally, such power could be supplied by a cable that extends within the directional drillhole 104 to the surface 102, but that cable then creates a pathway along which hazardous waste could escape (e.g., through a mobile liquid). A conventional alternative to wired power could be to include a battery at depth, but batteries have limited lifetimes.

Example implementations of the power generator system 500 generates electrical power in the hazardous waste repository of a deep directional drillhole 104, e.g., to power one or more instruments that monitor hazardous waste stored in the repository. In some aspects, the hazardous waste is radioactive waste, such as SNF or high level waste. In some aspects. the power generator system 500 utilizes heat generated by the stored radioactive waste to generate electrical power.

As shown in FIG. 5A (and with reference to certain components shown in FIG. 1), nuclear waste canisters 126 that enclose radioactive waste 145 (e.g., SNF assemblies) are emplaced in a hazardous waste repository in the directional drillhole 104. For example, in some aspects, a single nuclear waste canister 126 that stores nuclear waste in the directional drillhole 104 (and more specifically, the horizontal drillhole portion 110) produces heat energy at a rate of several hundred watts. As that energy is conducted away, e.g., through any filling within the drillhole portion 110, through casing 120 (if casing is used) and into the rock of the subterranean formation 118, the heat creates a temperature difference that can be exploited to obtain electric (or mechanical) power.

Figure 5C:
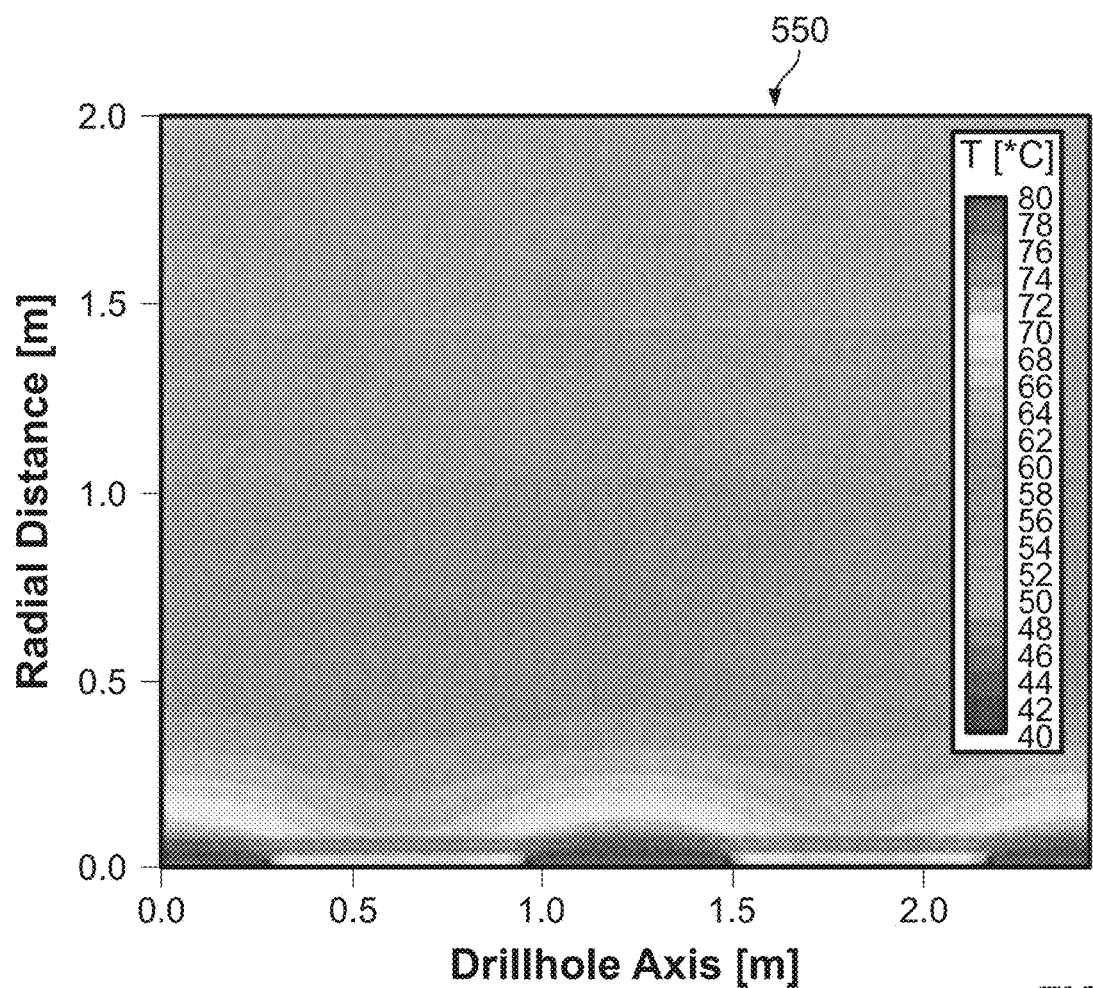
FIG. 5C is a graph that illustrates a temperature profile of a hazardous waste repository in a directional drillhole according to the present disclosure.

In an example implementation, a nuclear waste canister 126 may enclose a single spent nuclear fuel assembly (represented as 145 in FIG. 5A). There may be several nuclear waste canisters 126 placed end-to-end within the hazardous waste repository of the directional drillhole portion 110. A temperature profile of such a configuration is shown in FIG. 5C, as a chart 550 of temperature at a radial distance from center of the canisters 126 along a cased drillhole axis (e.g., of the drillhole portion 110). In chart 550, the x-axis represents a distance (in meters) along the horizontal drillhole portion 110 in which the canisters 126 are emplaced. The y-axis represents a radial distance (in meters) from a centerline axis of the canisters 126.

This configuration assumes a 100 W rate of power generation per canister 126 and a four foot spacing between canisters 126. In this example, the temperature difference between the end of the canisters 126 and the center of the four foot (cooler) gap between the canisters is about 20° C. This temperature difference, in some aspects, can be used to generate power by the power generator system 500.

In the example implementation of power generator system 500, thermoelectric power is generated from heat that is output from the nuclear waste 145. For instance, the power generator system 500 may use or include a radioisotope thermal generators (RTG). As shown in FIG. 5A, the power generator system 500 is positioned in the directional drillhole 104 (e.g., in the horizontal drillhole portion 110) in an annular space between, e.g., the four foot gap between, adjacent nuclear waste canisters 126. The example power generator system 500 includes at least one flat sheet thermoelectric generator 506 positioned between heat transfer conductors 504 and heat transfer conductors 502. In this example, the heat transfer conductors 504 may be heat source conductors 504, as they are positioned closer to a heat source of the closest nuclear waste canister 126. The heat transfer conductors 502 may be heat sink conductors 502, as they are positioned further (relative to the conductors 504) from the heat source of the closest nuclear waste canister 126.

An example implementation of the thermoelectric generator 506 is shown in FIG. 5B. As shown, the thermoelectric generator 506 includes plates 507 and 509 (e.g., ceramic plates) that provide thermal (e.g., conductive) contact with the respective heat sink conductors 502 and the heat source conductors 504. In some aspects, the plates 507 and 509 may be the conductors 502 and 504, respectively. Mounted between the plates 507 and 509 are n- and p-type semiconductor materials 511 that are in contact with the plates 507 and 509 through conductive members 513. Poles 514 are electrically connected to the thermoelectric generator 506 to provide current, I, based on operation of the generator 506.

In some examples, the power generator system 500 may include or be placed in a container to hold the illustrated components. As shown, springs 508 are included to bias or urge the heat source conductors 504 and heat sink conductors 502 against the casing 120. However, the power generator system 500 could also be put inside a container that serves another purpose. For example, the power generator system 500 could be placed inside a device that measures temperature and pressure and the radioactivity of the environment, and which records such data or broadcasts the data to a distant recorder (e.g., on the terranean surface 102).

In FIG. 5A, the flat sheet of the thermoelectric generator 506 is shown perpendicular to the illustration, but the generator 506 could be any orientation. As shown, a region to the right of the heat sink conductor 502 is empty. However, in some aspects, another set of thermoelectric conductors 506 can be placed in that region as well. For example, FIG. 5A shows the power generator system 500 filling the space 516 between two nuclear waste canisters 126 in the horizontal drillhole portion 110. In some aspects, however, depending on the desired amount of generated power, fewer thermoelectric generators 506 can be used, although longer heat conductors 502 and 504 might then be used to bring in heat from the hottest regions 518 of the drillhole portion 110.

As further shown in FIG. 5A, radiation (e.g., gamma ray) shields 512 may be placed on ends of the nuclear waste canisters 126. A further radiation shield 510 may also be positioned near or in contact with the power generator system 500 to, e.g., reduce the exposure of the thermoelectric generators 506 to gamma rays from the nuclear waste 145. In some aspects, additional shielding could be added to the power generator system 500. In some aspects, radiation shielding is a tungsten shield, since tungsten is a gamma ray absorber and has good long-term anti-corrosion properties. Other gamma ray absorption materials may be used.

In some aspects, the power generator system 500 is made of radiation resistant materials. Example implementations that use radiation resistant materials may not generate as much power (e.g., current) as a design that uses conventional materials. Such generators might use, for example, metals with different thermoelectric properties in contact with each other, rather than using semiconductors.

In operation, the example implementation of the power generator system 500 has no moving parts other than the springs 508, which urge the heat transfer conductors 502 and 504 against the casing 120. During operation, only electrons move. The heat source conductor 504 conducts heat along a gap between the nuclear waste canisters 126 to a side of a thermoelectric generator 506. Another side of the thermoelectric generator 506 is in thermal contact (e.g., conductive) with a heat sink, e.g., a material in the drillhole portion 110 that is cooler than the canister 126, through the heat sink conductor 502. For example, the heat sink material may be fluid 127 or other filler material 127 within the drillhole portion 110, or the material may be an inner surface of the drillhole casing 120 (e.g., a carbon steel casing). Based on a temperature difference between the conductors 502 and 504 and across the thermoelectric generator 506, an electrical current is generated by the thermoelectric generator 506, which can be provided to one or more components or systems in the hazardous waste repository that require electrical power.

In some aspects, the heat source conductor 504 may be attached to the nuclear waste canister 126 or other hot surface, such as the drillhole filler or casing 120 in a hot region near a canister 126. In some aspects, one or both of the heat source conductor 504 or heat sink conductor 502 may be a rod made of metal or some other conductive material such as glass. Alternatively, one or both of the heat source conductor 504 or heat sink conductor 502 may be a heat pipe or other heat transfer device such as a tube containing a gas such as helium.

In some aspects, the power generator system 500 may provide other forms of power besides electrical power. For instance, based on the described temperature difference between the heat source and the heat sink, a differential pressure pump may be implemented based on a density difference at two ends of a tube caused by the temperature difference. If the tube were then closed in the middle, the density difference would become a pressure difference, and this pressure difference could be used to drive a generator or to send a signal directly to the surface using an acoustic wave. As another example, a power generator system may generate power directly from the gamma rays generated by the nuclear waste rather than from a temperature difference.

Figure 5D:
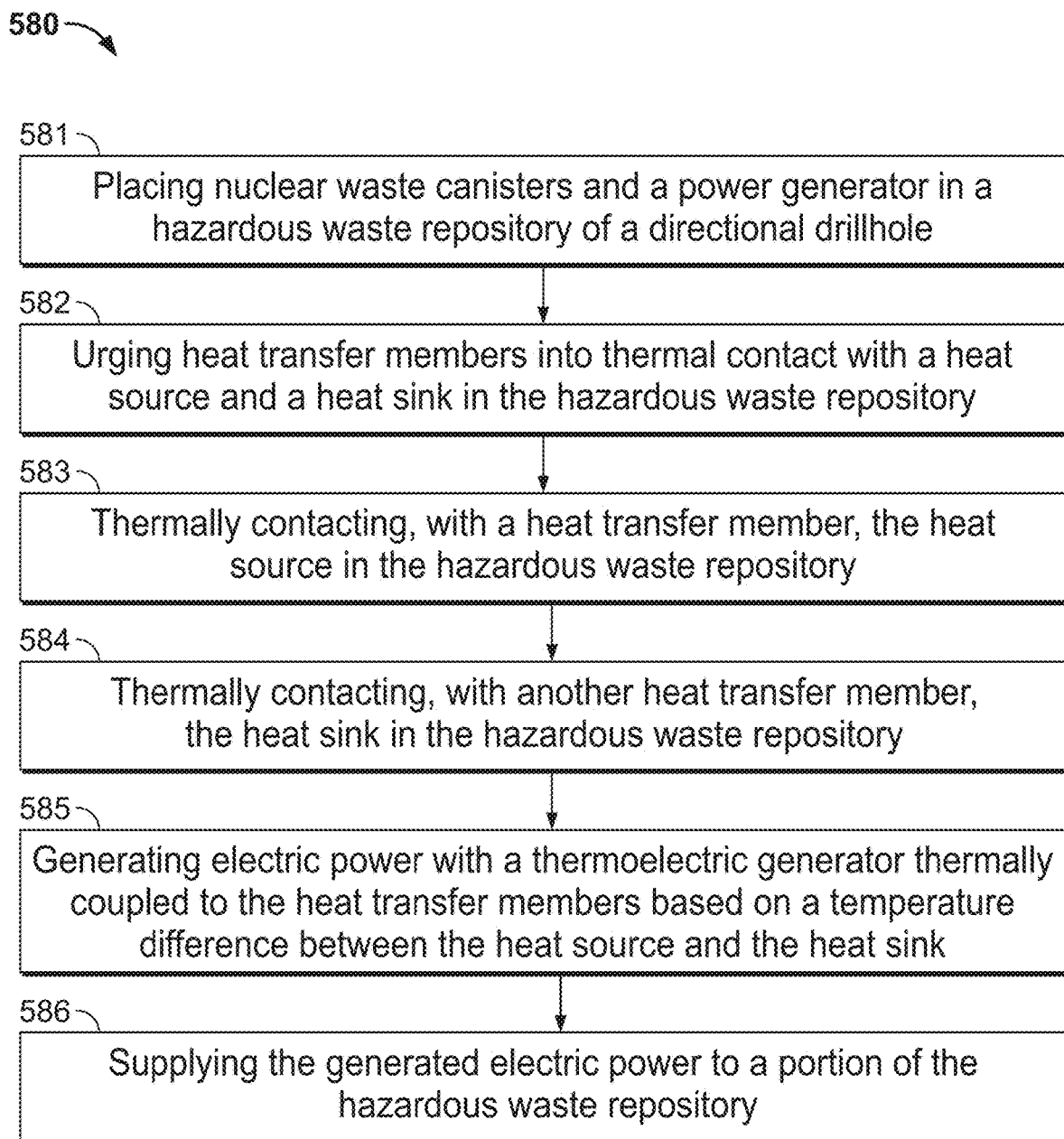
FIG. 5D is a flowchart that illustrates an example process that includes generating electric power with the power generator system of FIG. 5A.

FIG. 5D is a flowchart that illustrates an example process 580 that includes generating electric power with the power generator system 500 of FIG. 5A. Process 580 may begin at step 581, which includes placing one or more nuclear waste canisters and a power generator system (e.g., power generator system 500) in a hazardous waste repository of a directional drillhole. For example, one or more nuclear waste canisters that enclose radioactive, or nuclear, waste may be emplaced in the horizontal drillhole portion of the directional drillhole. In some aspects, all or a portion of the horizontal drillhole portion comprises a hazardous waste repository. The radioactive waste generates heat and radiation (e.g., gamma rays). In some aspects, the generated heat is transferred from the waste to the canister and, in some cases, an annulus of the drillhole portion. In an example embodiment, the emplaced power generator system is positioned in a space between adjacent nuclear waste canisters in the horizontal drillhole portion.

Process 580 may continue at step 582, which includes urging heat transfer members of the power generator system into thermal contact with a heat source and a heat sink in the hazardous waste repository. For example, the power generator system may include a first heat transfer member that is urged (e.g., with springs or another biasing member) into thermal contact (e.g., conductive thermal contact, or convective thermal contact, or both) with a heat source. The heat source may be, for example, one or more nuclear waste canisters, a casing portion heated by one or more nuclear waste canisters, a drillhole backfill material heated by one or more nuclear waste canisters, or a combination thereof. The power generator system may include a second heat transfer member that is urged (e.g., with springs or another biasing member) into thermal contact (e.g., conductive thermal contact, or convective thermal contact, or both) with a heat sink. The heat sink may be, for example, a fluid in the drillhole, a casing portion unheated by one or more nuclear waste canisters, a drillhole backfill material unheated by one or more nuclear waste canisters, or a combination thereof Process 580 may continue at step 583, which includes thermally contacting, with a heat transfer member, the heat source in the hazardous waste repository. For example, the first heat transfer member is placed into thermal contact (and in some aspects, physical contact) with the heat source so that a temperature of the first heat transfer member is adjusted to at or near a temperature of the heat source.

Process 580 may continue at step 584, which includes thermally contacting, with another heat transfer member, the heat sink in the hazardous waste repository. For example, the second heat transfer member is placed into thermal contact (and in some aspects, physical contact) with the heat sink so that a temperature of the second heat transfer member is adjusted to at or near a temperature of the heat sink (which is less than the heat source).

Process 580 may continue at step 585, which includes generating electric power with a thermoelectric generator thermally coupled to the heat transfer members based on a temperature difference between the heat source and the heat sink. For example, the thermoelectric generator is thermally coupled to the heat transfer members such that the temperature difference between the heat source and heat sink is translated across, e.g., semiconductor material of the thermoelectric generator. The semiconductor material generates an electric current based on the temperature difference.

Process 580 may continue at step 586, which includes supplying the generated electric power to a portion of the hazardous waste repository. For example, in some aspects, the generated electrical power may be supplied to one or more components of a hazardous waste repository monitoring system, such as radiation sensors, temperature sensors, liquid sensors, or control systems (e.g., microprocessor based systems) communicably coupled to such sensors. In some aspects, such sensors or control systems (e.g., as described in U.S. patent application Ser. No. 16/430,005, incorporated by reference herein) may be located in the horizontal drillhole portion, another drillhole portion of the directional drillhole, or another directional or vertical drillhole formed in or adjacent the subterranean formation in which the hazardous waste repository is located. In some aspects, such sensors or control systems may be located at or near the terranean surface and electrical power is supplied from the power generator system toward the surface.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A first example implementation according to the present disclosure includes a nuclear waste dry cask that includes a housing that at least partially defines an inner volume sized to enclose a plurality of nuclear waste canisters. Each nuclear waste canister is sized to store a portion of nuclear waste. The housing includes radiation shielding. The cask further includes a lid sized to enclose a top opening of the inner volume and comprising radiation shielding; and a bottom sized to enclose a bottom opening of the inner volume and comprising radiation shielding.

In an aspect combinable with the first example implementation, the portion of nuclear waste comprises a spent nuclear fuel (SNF) assembly.

In another aspect combinable with any of the previous aspects of the first example implementation, each nuclear waste canister is sized to store a single SNF assembly.

In another aspect combinable with any of the previous aspects of the first example implementation, the radiation shielding comprises a material that absorbs gamma rays or prevents gamma rays from passing therethrough.

In another aspect combinable with any of the previous aspects of the first example implementation, the bottom is configured to move to expose the bottom opening of the inner volume.

In another aspect combinable with any of the previous aspects of the first example implementation, the bottom is slideable to expose the bottom opening of the inner volume.

In another aspect combinable with any of the previous aspects of the first example implementation, each SNF canister comprises radiation shielding only on a top surface and a bottom surface of the SNF canister.

In another aspect combinable with any of the previous aspects of the first example implementation, the radiation shielding comprises concrete.

In another aspect combinable with any of the previous aspects of the first example implementation, the lid is configured to move to expose the top opening of the inner volume.

In another aspect combinable with any of the previous aspects of the first example implementation, the plurality of nuclear waste canisters comprise at least fifteen nuclear waste canisters.

A second example implementation according to the present disclosure includes a method for storing nuclear waste that includes placing a plurality of nuclear waste canisters in a nuclear waste dry cask that comprises a housing that at least partially defines an inner volume sized to enclose the plurality of nuclear waste canisters. Each nuclear waste canister is sized to store a portion of nuclear waste. The housing includes radiation shielding. The method further includes enclosing a top opening of the inner volume with a lid that comprises radiation shielding; and enclosing a bottom opening of the inner volume with a bottom that comprises radiation shielding.

In an aspect combinable with the second example implementation, the portion of nuclear waste comprises a spent nuclear fuel (SNF) assembly.

In another aspect combinable with any of the previous aspects of the second example implementation, each nuclear waste canister is sized to store a single SNF assembly.

In another aspect combinable with any of the previous aspects of the second example implementation, the radiation shielding comprises a material that absorbs gamma rays or prevents gamma rays from passing therethrough.

Another aspect combinable with any of the previous aspects of the second example implementation further includes moving the nuclear waste dry cask over a vertical entrance of a directional drillhole.

Another aspect combinable with any of the previous aspects of the second example implementation further includes moving the bottom to expose the bottom opening of the inner volume to the vertical entrance.

In another aspect combinable with any of the previous aspects of the second example implementation, moving the bottom comprises sliding the bottom to expose the bottom opening of the inner volume to the vertical entrance.

Another aspect combinable with any of the previous aspects of the second example implementation further includes moving at least one of the nuclear waste canisters out of the inner volume, through the bottom opening, and into the vertical entrance.

Another aspect combinable with any of the previous aspects of the second example implementation further includes moving all of the nuclear waste canisters out of the inner volume, through the bottom opening, and into the vertical entrance.

Another aspect combinable with any of the previous aspects of the second example implementation further includes moving at least one of the nuclear waste canisters into a hazardous waste repository of the directional drillhole.

In another aspect combinable with any of the previous aspects of the second example implementation, each SNF canister comprises radiation shielding only on a top surface and a bottom surface of the SNF canister.

In another aspect combinable with any of the previous aspects of the second example implementation, the radiation shielding comprises concrete.

In another aspect combinable with any of the previous aspects of the second example implementation, the lid is configured to move to expose the top opening of the inner volume.

In another aspect combinable with any of the previous aspects of the second example implementation, the plurality of nuclear waste canisters comprise at least fifteen nuclear waste canisters.

A third example implementation includes a method for forming a directional drillhole for hazardous waste storage includes identifying a subterranean formation suitable to store hazardous waste; determining one or more faults that extend through the subterranean formation; forming a vertical drillhole from a terranean surface toward the subterranean formation; and forming a directional drillhole from the vertical drillhole that extends in or under the subterranean formation and parallel to at least one of the one or more faults. The directional drillhole includes a hazardous waste repository configured to store the hazardous waste.

An aspect combinable with the third example implementation further includes forming the directional drillhole perpendicular to a direction of maximum horizontal stress of the subterranean formation.

In another aspect combinable with any of the previous aspects of the third example implementation, the subterranean formation is located in an area of high risk of seismic activity.

In another aspect combinable with any of the previous aspects of the third example implementation, the seismic activity includes earthquakes.

In another aspect combinable with any of the previous aspects of the third example implementation, the hazardous waste includes radioactive or nuclear waste.

In another aspect combinable with any of the previous aspects of the third example implementation, the nuclear waste includes spent nuclear fuel or high level waste.

In another aspect combinable with any of the previous aspects of the third example implementation, the subterranean formation includes at least one of shale, clay, or salt.

In another aspect combinable with any of the previous aspects of the third example implementation, the one or more faults includes at least two parallel faults.

In another aspect combinable with any of the previous aspects of the third example implementation, forming the directional drillhole includes forming the directional drillhole between and parallel to the at least two parallel faults.

In another aspect combinable with any of the previous aspects of the third example implementation, determining the one or more faults includes determining the one or more faults based on at least one of one or more seismic records; one or more seismic reflection surveys; a geologic mapping; or one or more electromagnetic (EM) surveys.

In another aspect combinable with any of the previous aspects of the third example implementation, the directional drillhole does not cross the one or more faults.

In a fourth example implementation, a hazardous waste repository system includes a directional drillhole that extends from an entry proximate a terranean surface to a subterranean formation that includes one or more faults that extend through the subterranean formation. The directional drillhole includes a substantially vertical portion coupled to the entry, a transition portion coupled to the substantially vertical portion, and a substantially horizontal portion that is coupled to the transition portion and is formed in or under the subterranean formation and parallel to at least one of the one or more faults. The system further includes a hazardous waste repository formed in the substantially horizontal portion of the directional drillhole; a storage container positioned in the hazardous waste repository, the storage container including an inner volume sized to enclose hazardous waste material; and a seal positioned in the directional drillhole that isolates the hazardous waste repository from the entry.

In an aspect combinable with the fourth implementation, the directional drillhole extends perpendicular to a direction of maximum horizontal stress of the subterranean formation.

In another aspect combinable with any of the previous aspects of the fourth example implementation, the subterranean formation is located in an area of high risk of seismic activity.

In another aspect combinable with any of the previous aspects of the fourth example implementation, the seismic activity includes earthquakes.

In another aspect combinable with any of the previous aspects of the fourth example implementation, the hazardous waste material includes radioactive or nuclear waste.

In another aspect combinable with any of the previous aspects of the fourth example implementation, the nuclear waste includes spent nuclear fuel or high level waste.

In another aspect combinable with any of the previous aspects of the fourth example implementation, the subterranean formation includes at least one of shale, clay, or salt.

In another aspect combinable with any of the previous aspects of the fourth example implementation, the one or more faults includes at least two parallel faults.

In another aspect combinable with any of the previous aspects of the fourth example implementation, the directional drillhole extends between and parallel to the at least two parallel faults.

In another aspect combinable with any of the previous aspects of the fourth example implementation, the one or more faults are determined based on at least one of one or more seismic records; one or more seismic reflection surveys; a geologic mapping; or one or more electromagnetic (EM) surveys.

In another aspect combinable with any of the previous aspects of the fourth example implementation, the directional drillhole does not cross the one or more faults.

A fifth example implementation according to the present disclosure includes a drillhole plug that includes a frame or housing comprising a corrosion-resistant material and sized to fit within a milled portion of a directional drillhole that comprises a hazardous waste repository; and a material that fills at least a portion of the frame or housing. The material exhibits creep such that the material fills one or more voids between the frame or housing and a subterranean formation adjacent the milled portion of the directional drillhole.

In an aspect combinable with the fifth example implementation, the milled portion is located at a vertical portion of the directional drillhole.

In another aspect combinable with any of the previous aspects of the fifth example implementation, the milled portion does not include casing and other portions of the directional drillhole comprise casing.

In another aspect combinable with any of the previous aspects of the fifth example implementation, the material comprises a natural material.

In another aspect combinable with any of the previous aspects of the fifth example implementation, the natural material comprises a rock material.

In another aspect combinable with any of the previous aspects of the fifth example implementation, the rock material comprises at least one of shale, clay, or salt.

In another aspect combinable with any of the previous aspects of the fifth example implementation, the rock material is the same or substantially the same as the subterranean formation.

In another aspect combinable with any of the previous aspects of the fifth example implementation, the rock material is different than the subterranean formation.

In another aspect combinable with any of the previous aspects of the fifth example implementation, an outer diameter of the plug is greater than an outer diameter of the directional drillhole.

In another aspect combinable with any of the previous aspects of the fifth example implementation, the outer diameter of the plug is less than a diameter of the milled portion.

A sixth example implementation according to the present disclosure includes a method for sealing a drillhole that includes milling a portion of a directional drillhole that comprises a hazardous waste repository; inserting a drillhole plug into the milled portion; and sealing the directional drillhole with the material of the drillhole plug that fills one or more voids between the frame or housing and a subterranean formation adjacent the milled portion of the directional drillhole. The drillhole plug includes a frame or housing that comprises a corrosion-resistant material and a material that fills at least a portion of the frame or housing. The material exhibits creep.

In an aspect combinable with the sixth example implementation, the milled portion is located at a vertical portion of the directional drillhole.

In another aspect combinable with any of the previous aspects of the sixth example implementation, the milled portion does not include casing and other portions of the directional drillhole comprise casing.

In another aspect combinable with any of the previous aspects of the sixth example implementation, the material comprises a natural material.

In another aspect combinable with any of the previous aspects of the sixth example implementation, the natural material comprises a rock material.

In another aspect combinable with any of the previous aspects of the sixth example implementation, the rock material comprises at least one of shale, clay, or salt.

In another aspect combinable with any of the previous aspects of the sixth example implementation, the rock material is the same or substantially the same as the subterranean formation.

In another aspect combinable with any of the previous aspects of the sixth example implementation, the rock material is different than the subterranean formation.

In another aspect combinable with any of the previous aspects of the sixth example implementation, an outer diameter of the plug is greater than an outer diameter of the directional drillhole.

In another aspect combinable with any of the previous aspects of the sixth example implementation, the outer diameter of the plug is less than a diameter of the milled portion.

A fifth example implementation according to the present disclosure includes a power generator system that includes one or more heat transfer members configured to contact a heat source in a hazardous waste repository of a directional drillhole that stores nuclear waste in one or more nuclear waste canisters and a heat sink in the hazardous waste repository; and one or more thermoelectric generators thermally coupled to the one or more heat transfer members and configured to generate electric power based on a temperature difference between the heat source and the heat sink.

In an aspect combinable with the fifth example implementation, the nuclear waste comprises spent nuclear fuel.

In another aspect combinable with any of the previous aspects of the fifth example implementation, the heat source comprises at least one of the nuclear waste canisters or a casing disposed in the drillhole.

In another aspect combinable with any of the previous aspects of the fifth example implementation, the heat sink comprises at least one of the casing disposed in the drillhole or a material that at least partially fills the drillhole.

In another aspect combinable with any of the previous aspects of the fifth example implementation, the material comprises a liquid.

Another aspect combinable with any of the previous aspects of the fifth example implementation further includes one or more biasing members configured to urge the one or more heat transfer members into thermal contact with the heat source and the heat sink.

Another aspect combinable with any of the previous aspects of the fifth example implementation further includes at least one radiation shield.

In another aspect combinable with any of the previous aspects of the fifth example implementation, the radiation shield comprises tungsten.

In another aspect combinable with any of the previous aspects of the fifth example implementation, the one or more heat transfer members comprise a radiation resistant material.

In another aspect combinable with any of the previous aspects of the fifth example implementation, the one or more thermoelectric generators comprise a radiation resistant material.

A sixth example implementation according to the present disclosure includes a method for generating power in a hazardous waste repository of a directional drillhole that stores nuclear waste that includes contacting, with one or more heat transfer members of a power generator system, a heat source in the hazardous waste repository of the directional drillhole that stores nuclear waste in one or more nuclear waste canisters; contacting, with the one or more heat transfer members of the power generator system, a heat sink in the hazardous waste repository; and generating electric power with one or more thermoelectric generators thermally coupled to the one or more heat transfer members based on a temperature difference between the heat source and the heat sink.

In an aspect combinable with the sixth example implementation, the nuclear waste comprises spent nuclear fuel.

In another aspect combinable with any of the previous aspects of the sixth example implementation, the heat source comprises at least one of the nuclear waste canisters or a casing disposed in the drillhole.

In another aspect combinable with any of the previous aspects of the sixth example implementation, the heat sink comprises at least one of the casing disposed in the drillhole or a material that at least partially fills the drillhole.

In another aspect combinable with any of the previous aspects of the sixth example implementation, the material comprises a liquid.

Another aspect combinable with any of the previous aspects of the sixth example implementation further includes urging, with one or more biasing members of the power generator system, the one or more heat transfer members into thermal contact with the heat source and the heat sink.

Another aspect combinable with any of the previous aspects of the sixth example implementation further includes shielding gamma rays generated by the nuclear waste from the power generator system with at least one radiation shield.

In another aspect combinable with any of the previous aspects of the sixth example implementation, the radiation shield comprises tungsten.

In another aspect combinable with any of the previous aspects of the sixth example implementation, the one or more heat transfer members comprise a radiation resistant material.

In another aspect combinable with any of the previous aspects of the sixth example implementation, the one or more thermoelectric generators comprise a radiation resistant material.

A seventh example implementation according to the present disclosure includes a drillhole sealing system that includes a plurality of drillhole seals. Each drillhole seal includes a frame or housing comprising a corrosion-resistant material and sized to fit within a particular milled portion of a directional drillhole that comprises a hazardous waste repository; and a particular rock material that fills at least a portion of the frame or housing. The rock material is selected to match a geologic formation at a depth at which the particular drillhole seal is set and exhibits creep such that the material fills one or more voids between the frame or housing and the geologic formation at the depth and adjacent the particular milled portion of the directional drillhole.

In an aspect combinable with the seventh example implementation, each particular milled portion is located at a vertical portion of the directional drillhole.

In another aspect combinable with any of the previous aspects of the seventh example implementation, each particular milled portion does not include casing and other portions of the directional drillhole comprise casing.

In another aspect combinable with any of the previous aspects of the seventh example implementation, the particular rock material comprises at least one of shale, clay, or salt.

In another aspect combinable with any of the previous aspects of the seventh example implementation, an outer diameter of each drillhole seal is greater than an outer diameter of the directional drillhole.

In another aspect combinable with any of the previous aspects of the seventh example implementation, the outer diameter of each drillhole seal is less than a diameter of the particular milled portion.

In another aspect combinable with any of the previous aspects of the seventh example implementation, the particular rock material of one of the plurality of drillhole seals is different than the particular rock material of another of the plurality of drillhole seals.

In another aspect combinable with any of the previous aspects of the seventh example implementation, a number of the plurality of drillhole seals matches a number of geologic formations between a terranean surface and subterranean formation in which the hazardous waste repository is formed.

In another aspect combinable with any of the previous aspects of the seventh example implementation, the particular rock material of each of the plurality of drillhole seals matches a respective geologic formation adjacent the drillhole seal.

In another aspect combinable with any of the previous aspects of the seventh example implementation, each frame or housing loosely contains the particular rock material.

In another aspect combinable with any of the previous aspects of the seventh example implementation, the frame or housing comprises a wire or mesh enclosure.

An eighth example implementation according to the present disclosure includes a method for sealing a drillhole that includes milling a first portion of a directional drillhole that comprises a hazardous waste repository and inserting a first drillhole plug into the first milled portion. The first drillhole plug includes a frame or housing that comprises a corrosion-resistant material and a first rock material that fills at least a portion of the frame or housing. The first rock material is selected to match a geologic formation at a depth at which the first drillhole plug is set and exhibits creep such that the first rock material fills one or more voids between the frame or housing and the geologic formation at the depth and adjacent the first milled portion of the directional drillhole. The method further includes milling a second portion of the directional drillhole and inserting a second drillhole plug into the second milled portion. The second drillhole plug includes a frame or housing that comprises the corrosion-resistant material and a second rock material that fills at least a portion of the frame or housing. The second rock material is selected to match a geologic formation at a depth at which the second drillhole plug is set and exhibits creep such that the second rock material fills one or more voids between the frame or housing and the geologic formation at the depth and adjacent the second milled portion of the directional drillhole. The method further includes sealing the directional drillhole with the first and second rock materials of the respective first and second drillhole plugs that fill one or more voids between the frames or housings and a subterranean formation adjacent the first and second milled portions of the directional drillhole.

In an aspect combinable with the eighth example implementation, at least one of the first or second milled portions is located at a vertical portion of the directional drillhole.

In another aspect combinable with any of the previous aspects of the eighth example implementation, each of the first and second milled portions does not include casing and other portions of the directional drillhole comprise casing.

In another aspect combinable with any of the previous aspects of the eighth example implementation, at least one of the first or second rock materials comprises at least one of shale, clay, or salt.

In another aspect combinable with any of the previous aspects of the eighth example implementation, an outer diameter of each of the first and second drillhole plugs is greater than an outer diameter of the directional drillhole.

In another aspect combinable with any of the previous aspects of the eighth example implementation, the outer diameter of each of the first and second drillhole plugs is less than a diameter of the respective first and second milled portions.

In another aspect combinable with any of the previous aspects of the eighth example implementation, the first rock material is different than the second rock material.

In another aspect combinable with any of the previous aspects of the eighth example implementation, each frame or housing loosely contains the respective first or second rock material.

In another aspect combinable with any of the previous aspects of the eighth example implementation, the frame or housing comprises a wire or mesh enclosure.

In another aspect combinable with any of the previous aspects of the eighth example implementation, the second drillhole plug is uphole of and is in contact with the first drillhole plug.

Another aspect combinable with any of the previous aspects of the eighth example implementation further includes milling a third portion of the directional drillhole; and inserting a third drillhole plug into the third milled portion.

In another aspect combinable with any of the previous aspects of the eighth example implementation, the third drillhole plug includes a frame or housing that comprises a corrosion-resistant material and a third rock material that fills at least a portion of the frame or housing.

In another aspect combinable with any of the previous aspects of the eighth example implementation, the third rock material selected to match a geologic formation at a depth at which the third drillhole plug is set.

In another aspect combinable with any of the previous aspects of the eighth example implementation, the third rock material exhibits creep such that the third rock material fills one or more voids between the frame or housing and the geologic formation at the depth and adjacent the third milled portion of the directional drillhole.

Another aspect combinable with any of the previous aspects of the eighth example implementation further includes further sealing the directional drillhole with the third rock material of the third drillhole plug that fill one or more voids between the frame or housing and the subterranean formation adjacent the third milled portion of the directional drillhole.

A number of implementations have been described. Nevertheless, it will be understood that various modifications may be made without departing from the spirit and scope of the disclosure. For example, example operations, methods, or processes described herein may include more steps or fewer steps than those described. Further, the steps in such example operations, methods, or processes may be performed in different successions than that described or illustrated in the figures. Accordingly, other implementations are within the scope of the following claims.

What is claimed is:

1. A power generator, comprising:
a drillhole formed from a terranean surface into a subterranean formation;
a hazardous waste repository formed in the drillhole;
one or more nuclear waste canisters positioned in the hazardous waste repository, each of the one or more nuclear waste canisters storing nuclear waste;
one or more heat source heat transfer members in at least thermal contact with a heat source in the hazardous waste repository;
one or more heat sink heat transfer members in at least thermal contact with a heat sink in the hazardous waste repository;
one or more thermoelectric generators thermally coupled to the one or more heat source heat transfer members and the one or more heat sink heat transfer members, the one or more thermoelectric generators configured to generate electric power based on a temperature difference between the heat source and the heat sink; and
two or more springs configured to urge the one or more heat source heat transfer members and the one or more heat sink heat transfer members into contact with a casing positioned in the drillhole.

2. The power generator of claim 1, wherein the nuclear waste comprises spent nuclear fuel.

3. The power generator of claim 1, wherein the heat source comprises at least one of the one or more nuclear waste canisters or the casing positioned in the drillhole.

4. The power generator of claim 1, wherein the heat sink comprises at least one of the casing positioned in the drillhole or a material that at least partially fills the drillhole.

5. The power generator of claim 4, wherein the material comprises a liquid.

6. The power generator of claim 1, wherein the one or more nuclear waste canisters comprises at least two nuclear waste canisters separated by a gap in the hazardous waste repository of four feet, and
the one or more thermoelectric generators is positioned in the gap, with a temperature at a midpoint of the gap being about 20° C. cooler than a temperature at either of the at least two nuclear waste canisters.

7. The power generator of claim 1, further comprising at least one radiation shield.

8. The power generator of claim 7, wherein the at least one radiation shield comprises tungsten.

9. The power generator of claim 7, wherein the at least one radiation shield comprises a first radiation shield positioned at an end of at least one of the one or more nuclear waste canisters, and a second radiation shield positioned near or in contact with the one or more thermoelectric generators.

10. The power generator of claim 7, wherein the at least one radiation shield comprises a gamma ray shield.

11. A method for generating power in a hazardous waste repository of a drillhole that stores nuclear waste, comprising:
- thermally contacting, with one or more heat source heat transfer members of a power generator, a heat source in the hazardous waste repository of the drillhole that stores nuclear waste in one or more nuclear waste canisters;
- contacting, with one or more heat sink heat transfer members of the power generator, a heat sink in the hazardous waste repository;
- generating electric power with one or more thermoelectric generators thermally coupled to the one or more heat source heat transfer members and the one or more heat sink heat transfer members based on a temperature difference between the heat source and the heat sink; and
- urging, with two or more springs, the one or more heat source heat transfer members and the one or more heat sink heat transfer members into contact with a casing positioned in the drillhole.

12. The method of claim 11, wherein the nuclear waste comprises spent nuclear fuel.

13. The method of claim 11, wherein the heat source comprises at least one of the one or more nuclear waste canisters or the casing positioned in the drillhole.

14. The method of claim 11, wherein the heat sink comprises at least one of the casing positioned in the drillhole or a material that at least partially fills the drillhole.

15. The method of claim 14, wherein the material comprises a liquid.

16. The method of claim 11, wherein the one or more nuclear waste canisters comprises at least two nuclear waste canisters separated by a gap in the hazardous waste repository of four feet, and
the one or more thermoelectric generators is positioned in the gap, with a temperature at a midpoint of the gap being about 20° C. cooler than a temperature at either of the at least two nuclear waste canisters.

17. The method of claim 11, further comprising shielding gamma rays generated by the nuclear waste from the power generator with at least one radiation shield.

18. The method of claim 17, wherein the at least one radiation shield comprises tungsten.

19. The method of claim 17, wherein the at least one radiation shield comprises a first radiation shield positioned at an end of at least one of the one or more nuclear waste canisters, and a second radiation shield positioned near or in contact with the one or more thermoelectric generators.

20. The method of claim 17, wherein the at least one radiation shield comprises a gamma ray shield.

* * * * *